United States Patent
Jones et al.

(10) Patent No.: US 11,212,017 B2
(45) Date of Patent: Dec. 28, 2021

(54) PHASE-LOCKED LOOP (PLL) CALIBRATION

(71) Applicant: Qualcomm Incorporated, San Diego, CA (US)

(72) Inventors: Philip Jones, Cambridge (GB); Georgios Mylonas, Cambourne (GB); Andrew Gordon Summers, Lawshall (GB); Oleg Popov, Cambridge (GB)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/016,263

(22) Filed: Sep. 9, 2020

(65) Prior Publication Data

US 2021/0083782 A1   Mar. 18, 2021

(30) Foreign Application Priority Data

Sep. 13, 2019  (GR) .............................. 20190100393

(51) Int. Cl.
| | |
|---|---|
| H03D 3/24 | (2006.01) |
| H04B 17/21 | (2015.01) |
| H03L 7/089 | (2006.01) |
| H03L 7/099 | (2006.01) |

(52) U.S. Cl.
CPC .......... *H04B 17/21* (2015.01); *H03L 7/0891* (2013.01); *H03L 7/099* (2013.01)

(58) Field of Classification Search
CPC ..... H04B 17/21; H04B 17/318; H03L 7/0891; H03L 7/099; H03F 3/245
USPC ......................................... 375/373–376, 327
See application file for complete search history.

(56) References Cited

U.S. PATENT DOCUMENTS

| | | | |
|---|---|---|---|
| 7,508,898 | B2 | 3/2009 | Cyr et al. |
| 7,715,836 | B2 | 5/2010 | Vassiliou et al. |
| 9,461,653 | B2 | 10/2016 | Perrott |
| 9,935,640 | B1 | 4/2018 | Chan et al. |
| 10,063,366 | B2 | 8/2018 | Zanuso et al. |
| 2009/0310661 | A1* | 12/2009 | Kloper ................. H04B 17/318 375/224 |
| 2017/0141857 | A1* | 5/2017 | Casagrande ............ H03F 3/245 |

* cited by examiner

*Primary Examiner* — Phuong Phu
(74) *Attorney, Agent, or Firm* — Colby Nipper/Qualcomm

(57) ABSTRACT

An apparatus is disclosed that implements phase-locked loop (PLL) calibration. In an example aspect, the apparatus includes a PLL and a signal extraction path. The PLL includes an error determiner with an error output node and a loop filter with a filter input node and a filter output node. The filter input node is coupled to the error output node. The PLL also includes a voltage-controlled oscillator (VCO) with a VCO input node. The VCO input node is coupled to the filter output node. The PLL further includes a PLL tap node coupled between the filter output node and the VCO input node. The signal extraction path includes at least one switch, with the signal extraction path coupled to the PLL tap node.

30 Claims, 9 Drawing Sheets

PHASE-LOCKED LOOP (PLL) CALIBRATION

RELATED APPLICATION AND PRIORITY INFORMATION

This application claims the benefit of the filing date of Greece Patent Application No. 20190100393 filed 13 Sep. 2019, the entire contents of which is hereby incorporated by reference herein. Thus, this application claims the right of priority to Greece Patent Application No. 20190100393 filed 13 Sep. 2019.

TECHNICAL FIELD

This disclosure relates generally to wireless communication using an electronic device and, more specifically, to calibrating a phase-locked loop (PLL) using a signal extraction path coupled to a feedback loop of the PLL.

BACKGROUND

Electronic devices include traditional computing devices such as desktop computers, notebook computers, smartphones, wearable devices like a smartwatch, internet servers, and so forth. However, electronic devices also include other types of computing devices such as personal voice assistants, programmable thermostats, automotive electronics, robotics, intelligent devices embedded in other machines like refrigerators and industrial tools, Internet-of-Things (IoT) devices, and the like. These various electronic devices provide information, entertainment, social interaction, security, safety, productivity, transportation, and other services to human users. Thus, electronic devices play crucial roles in many aspects of modern society.

Many of the services provided by electronic devices in today's interconnected world depend at least partly on electronic communications. Electronic communications can include those exchanged between or among distributed electronic devices using wireless or wired signals that are transmitted over one or more networks, such as the Internet or a cellular network. Electronic communications can also include those exchanged between or among different printed circuit boards, modules, chips, or even cores or other circuit portions of a given integrated circuit that are located within a single electronic device. Regardless, electronic communications are usually accomplished by generating or propagating electrical or electromagnetic signals. Such electronic communications are typically performed using at least one signal that is designed to have a specified characteristic, such as a particular frequency. Generally, communication signals are more likely to be correctly transmitted and received, as well as properly interpreted, if the specified characteristic is accurately and reliably produced.

With regard to a frequency signal characteristic, a frequency synthesizer can be used to create, or synthesize, a desired frequency. Thus, electronic devices employ frequency synthesizers to synthesize signals having desired frequencies. Typically, a frequency synthesizer includes a frequency generator, such as a phase-locked loop (PLL). In operation, a PLL receives a reference signal having a reference frequency and applies the reference signal to a feedback loop. Using the feedback loop, the circuitry of the PLL generates an output signal that oscillates at a desired frequency based at least on the reference frequency of the reference signal.

A PLL of an electronic device therefore outputs an oscillating signal having a target synthesized frequency. The electronic device can use the synthesized frequency of the oscillating signal in one or more stages of a communication scenario. Example stages for communicating a signal include generating, transmitting, receiving, and interpreting a communication signal. In an example signal-generation stage, a frequency synthesized by a PLL can be used to modulate a communication signal. Here, the modulation entails encoding or adding information—such as a text and an associated photograph—to the communication signal. In an example signal-transmission stage, a frequency synthesized by a PLL can be employed to upconvert a frequency of a modulated communication signal using a mixer that is part of a receive chain. With an up-conversion operation, the mixer increases a frequency of the communication signal. The increased frequency enables the communication signal to be transmitted wirelessly as a radio-frequency (RF) electromagnetic signal that propagates in free space, e.g., between a smartphone and a cellular base station.

A PLL can also be used with the stages of a reception side of a typical communication scenario. For instance, a PLL can be used to down-convert a frequency of a received communication signal. After down-conversion, a PLL can be used to demodulate the down-converted communication signal to interpret the signal and thereby recover encoded information, such as the text message and the associated photograph. Additionally, a PLL can be used to produce a clock signal that controls a rate of operation of clock-synchronized circuitry of an integrated circuit. Examples of such an integrated circuit include a system-on-chip (SoC) that processes a communication signal and a graphics chip that processes video data that is being displayed to a user.

Thus, a PLL can be employed in multiple stages of a communication scenario to support electronic communications with electronic devices or in synchronously-operated circuitry to support coordinated interoperations among different components of electronic devices. However, a degree to which a synthesized frequency of a PLL is stable and accurate can vary. This variability can adversely impact the electronic communications or coordinated interoperations that are being supported by a PLL. Consequently, electrical engineers and other designers of electronic devices strive to improve the accurate functionality and stability of PLLs that are used to facilitate the electronic communications or high-speed synchronous operations of electronic devices.

SUMMARY

Calibration of a phase-locked loop (PLL) is disclosed herein. A PLL can include, for example, an error determiner, a loop filter, a voltage-controlled oscillator (VCO), and a frequency divider. Calibration of a PLL enables the PLL to provide a stable and accurate synthesized frequency for use by other analog or digital circuitry, as part of a modulation scheme, and so forth. Unfortunately, if a calibration operation is performed too slowly, then the VCO of the PLL can drift during the calibration, and this drifting jeopardizes the calibration results. Faster calibration operation using existing approaches, on the other hand, can be negatively impacted by higher phase noise, such as flicker phase noise of the VCO. Generally, noise from the PLL being calibrated or noise from calibration components, or both, can make accurate PLL calibration more difficult. Further, as circuitry is added to enable a PLL calibration procedure, the cost of an associated integrated circuit (IC) chip is increased.

One or more of these issues is addressed by the various PLL calibration implementations that are described herein. First, instead of using an output signal of a PLL, some implementations extract a signal from a PLL tap node positioned between a loop filter and a VCO of the PLL to increase an accuracy of a PLL calibration procedure. Digital circuitry uses the extracted signal to produce a calibration signal that is coupled to a calibration parameter input node of the PLL. Second, to decrease a cost of including PLL calibration functionality in an IC chip, some implementations "reuse" or "share" circuitry, which circuitry provides another functionality, to perform a PLL calibration procedure. For example, an analog-to-digital converter (ADC) that is deployed as part of a receive chain in a wireless transceiver can also be employed to support PLL calibration functionality.

Third, in other implementations, accuracy is increased, and costs are managed effectively. In an example operation of such implementations, a filtered error signal, which is output from a loop filter of the PLL, is extracted as an extracted signal that is in an analog form. An ADC, which is part of a receive chain of a wireless interface device, converts this analog extracted signal into a digital extracted signal for use in a PLL calibration procedure. Digital circuitry performs a calibration analysis to produce a calibration signal based on the digital extracted signal. In such implementations, noise is handled during the PLL calibration procedure, such as by using a discrete Fourier transform (DFT) operation. Additionally, circuitry is employed efficiently with a multi-use strategy. For instance, the ADC or other circuitry can be selectively used for PLL calibration at one time and for processing a received signal at another time.

In an example aspect, an apparatus is disclosed. The apparatus includes a phase-locked loop (PLL) and a signal extraction path. The PLL includes an error determiner having an error output node. The PLL also includes a loop filter having a filter input node and a filter output node, with the filter input node coupled to the error output node. The PLL additionally includes a voltage-controlled oscillator (VCO) having a VCO input node, with the VCO input node coupled to the filter output node. The PLL further includes a PLL tap node coupled between the filter output node and the VCO input node. The signal extraction path includes at least one switch, with the signal extraction path coupled to the PLL tap node.

In an example aspect, an apparatus is disclosed that includes a phase-locked loop (PLL). The PLL includes an error determiner having an error output node and a loop filter having a filter input node and a filter output node. The filter input node is coupled to the error output node. The PLL also includes a voltage-controlled oscillator (VCO) having a VCO input node, with the VCO input node coupled to the filter output node. The PLL further includes a PLL tap node coupled between the filter output node and the VCO input node. The apparatus also includes means for extracting an extracted signal from the PLL via the PLL tap node.

In an example aspect, a method for calibrating a phase-locked loop (PLL) is disclosed. The method includes operating a PLL feedback loop of the PLL to produce an error signal at a PLL tap node coupled between an output of a loop filter and an input of a voltage-controlled oscillator (VCO). The method also includes closing at least one switch coupled to the PLL tap node and, responsive to the closing, extracting the error signal from the PLL tap node as an extracted signal. The method additionally includes forwarding the extracted signal to an input of an analog-to-digital converter (ADC). The method also includes routing the extracted signal from an output of the ADC through digital circuitry to produce a calibration signal based on the extracted signal. The method further includes adjusting a PLL control parameter of the PLL based on the calibration signal.

In an example aspect, an apparatus is disclosed. The apparatus includes digital circuitry, at least one antenna, and an analog-to-digital converter (ADC). The ADC includes an ADC input node and an ADC output node, with the ADC input node coupled to the at least one antenna, and the ADC output node coupled to the digital circuitry. The apparatus also includes a phase-locked loop (PLL) having a PLL feedback loop. The PLL feedback loop includes an error determiner, a loop filter coupled to the error determiner, a voltage-controlled oscillator (VCO) coupled to the loop filter, a frequency divider coupled between the VCO and the error determiner, and a PLL tap node coupled along the PLL feedback loop. The apparatus further includes a signal extraction path coupled between the PLL tap node and the ADC input node of the ADC.

BRIEF DESCRIPTION OF DRAWINGS

FIG. 7-1 illustrates an example PLL calibration architecture in which the calibration signal is applied to at least one frequency-modulation path of PLL control circuitry.

FIG. 7-2 illustrates example aspects of a frequency-modulation path of the PLL control circuitry of FIG. 7-1.

FIG. 7-3 illustrates an example approach to ascertaining a gain to calibrate a PLL with a frequency-modulation path of the PLL control circuitry of FIG. 7-1.

DETAILED DESCRIPTION

Figure 1:
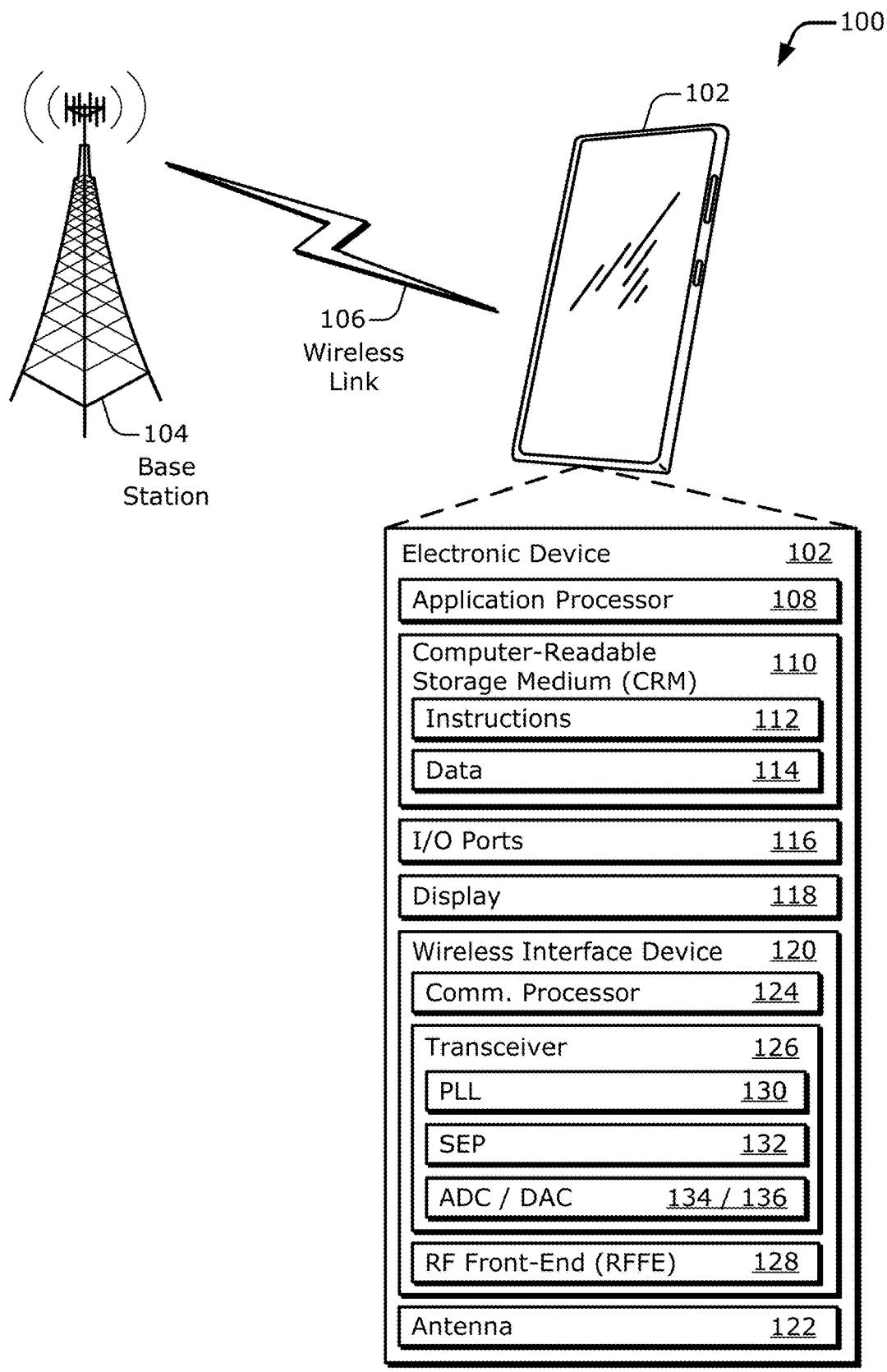
FIG. 1 illustrates an example environment with an electronic device having a wireless interface device, which includes a transceiver having a phase-locked loop (PLL) and an associated signal extraction path (SEP) for calibration of the PLL.

Generally, electronic communications are made using signals that oscillate at different frequencies. Electronic devices use various components to create signals having different signal characteristics, such as frequency synthesizers to generate signals having target frequencies. To do so, an oscillating signal is input to a feedback loop that produces a signal having a frequency characteristic that is targeted to facilitate an electronic communication. In addition to enabling the production and processing of communication signals, frequency synthesizers are used to generate clock signals that control the timing of processing operations in integrated circuits, such as a central processing unit (CPU), a graphics processing unit (GPU), or a system-on-chip (SoC).

Electronic devices use oscillating signals that rise and fall at some frequency, which frequency can be constant or can be changing responsive to a desired frequency modulation. For example, electronic devices can use oscillating signals to control a rate at which processing operations are performed, such as with a clock signal. Additionally or alternatively, electronic devices can use oscillating signals to facilitate transmission and reception of signals in different communication scenarios. For instance, oscillating signals can be used with mixers that perform frequency translation. Further, oscillating signals can be used to encode information by applying a frequency-based modulation to a signal.

These oscillating signals can be generated by a frequency synthesizer, which can include circuitry implementing some type of locked loop. The frequency synthesizer produces an output signal having a synthesized frequency that is based at least on a reference frequency of a reference signal and a divider value (e.g., a modulus value). The divider value controls how much the frequency synthesizer changes, such as increases, the reference frequency to produce the synthesized frequency of the output signal. An example of a locked loop is a phase-locked loop (PLL). By enabling the generation of signals having different synthesized frequencies, frequency synthesizers are instrumental in facilitating our modern interconnected society that relies on electronic devices having reliable communication signaling and high-speed processing. However, the accuracy and stability of frequency synthesizers is partially contingent on performance of the underlying circuitry, such as a feedback loop of a PLL or the control circuitry of the PLL.

To provide accuracy and stability in the synthesis of frequencies, PLL calibration is described herein. A PLL can include, for example, an error determiner, a loop filter, a voltage-controlled oscillator (VCO), and a frequency divider. Calibration of such a PLL enables the PLL to provide a stable and accurate synthesized frequency for use by other analog or digital circuitry or for adding modulation to a signal. Unfortunately, if a calibration operation is performed too slowly, then the VCO of the PLL can drift during the calibration, and this drifting jeopardizes the calibration results. Faster calibration operations using existing approaches, on the other hand, can be negatively impacted by higher phase noise, such as flicker phase noise of the VCO. Generally, noise from the PLL being calibrated or noise from components performing the calibration can make accurate PLL calibration more difficult. Further, any circuitry added to enable a PLL calibration procedure increases the cost of an associated integrated circuit (IC) chip.

One or more of these issues is addressed by the various PLL calibration implementations that are described herein. First, instead of using an output signal of a PLL, some implementations extract a signal from a PLL tap node positioned between a loop filter and a VCO of the PLL to increase an accuracy of a PLL calibration procedure. Digital circuitry uses the extracted signal to produce a calibration signal that is coupled to a calibration parameter input node of the PLL. Second, to decrease a cost of including PLL calibration functionality in an IC chip, some implementations "reuse" or "share" circuitry, which circuitry provides another functionality, to perform a PLL calibration procedure. For example, an analog-to-digital converter (ADC) that is deployed as part of a receive chain in a wireless transceiver can also be employed to support PLL calibration functionality.

Third, in other implementations, accuracy is increased as in the first implementations, and costs are effectively managed as in the second implementations. In an example operation of such third implementations, a filtered error signal, which is output from a loop filter of the PLL, is extracted as an extracted signal that is in an analog form. An ADC, which is part of a receive chain of a wireless interface device, converts this analog extracted signal into a digital extracted signal for use in a PLL calibration procedure. Digital circuitry performs a calibration analysis to produce a calibration signal based on the digital extracted signal. The calibration signal includes a calibration parameter that is coupled to the feedback loop of the PLL. In such implementations, noise is handled during the PLL calibration procedure, such as by using a discrete Fourier transform (DFT) operation. Additionally, circuitry is employed efficiently with a multi-use strategy. For instance, the ADC or other circuitry can be selectively used for PLL calibration at one time and for processing a received signal at another time.

Generally, for certain implementations, a PLL includes a PLL feedback loop and PLL control circuitry. The PLL feedback loop includes an error determiner, a loop filter, a VCO, and a frequency divider. The PLL feedback loop also includes a PLL tap node, and the PLL control circuitry includes a calibration parameter input node. A PLL calibration path extends between the PLL tap node and the calibration parameter input node. The PLL calibration path includes a signal extraction path and a feedback path. The signal extraction path includes at least one switch and is coupled to the PLL tap node and the feedback path. The feedback path is coupled between the signal extraction path and the calibration parameter input node. The feedback path includes an ADC and digital circuitry, such as modem or other communication processor. The PLL tap node can be positioned, for instance, between the loop filter and the VCO of the PLL feedback loop. The ADC, as well as at least parts of the digital circuitry, may be shared with other circuitry, such as a receive chain of a transceiver.

In an example operation, the signal extraction path extracts an extracted signal from the PLL tap node. The at least one switch of the signal extraction path is placed in a state (e.g., an open state or a closed state) so that an ADC input node of the ADC is coupled to the extracted signal via the signal extraction path. The ADC converts the extracted signal in an analog form into an extracted signal in a digital form and provides the digital extracted signal at an ADC output node of the ADC. The ADC output node is coupled to the digital circuitry. The digital circuitry accepts the digital extracted signal from the ADC output node and performs a calibration operation on the digital extracted signal. The calibration operation can be performed, for instance, responsive to a threshold, such as a previous value of the digital extracted signal or a maximum acceptable value thereof. The calibration operation can include use of a discrete Fourier transform (DFT) to analyze a particular frequency component of the digital extracted signal. Based on the calibration operation, the digital circuitry produces a calibration signal having a calibration parameter and provides the calibration signal to the calibration parameter input node of the PLL control circuitry. The PLL control circuitry adjusts operation of the PLL feedback loop responsive to the calibration parameter. The PLL feedback loop continues to run to produce an updated version of the extracted signal for the signal extraction path. The calibration operation can be repeated with updated versions of the extracted signal until the calibration procedure is completed.

In an example usage scenario, a PLL provides a synthesized frequency via an output signal. The PLL control circuitry of the PLL includes a current offset circuit, such as an offset digital-to-analog converter (DAC). The calibration parameter of the calibration signal affects how much current the current offset circuit applies to the PLL feedback loop to control a linearity of the error determiner thereof. The current can be injected at the error determiner, which can include a phase-frequency detector (PFD) and a charge pump. For instance, the PLL calibration path can produce a calibration parameter that adjusts an amount of current being injected into the PLL feedback loop so as to shift operation of a phase-frequency detector or a charge pump into a linear region. By operating in a linear region, noise in the PLL loop bandwidth is decreased, and fewer spurs are created, as compared to operation in a non-linear region. However, as more current is injected, noise and reference spurs that are caused partly by the current injection increase. It is therefore advantageous to inject an amount of current that shifts operation into a linear region without injecting more current once the linear region of operation is achieved. Thus, efficient and accurate calibration of the current offset circuit advantageously manages a level of noise and a magnitude of reference spurs experienced by the PLL.

In another example usage scenario, a PLL provides a frequency-modulated synthesized signal that can be transmitted via an antenna. A two-point modulated PLL is modulated at two points, such as two points selected from a reference signal input, a frequency divider value, or a VCO modulation input. If the reference signal is provided by a crystal oscillator, the VCO modulation input can provide modulation via the VCO, and the frequency divider can counteract this modulation as part of the PLL feedback loop to balance the two inputs. These two frequency-modulation paths produce a substantially counterbalancing effect on the PLL if the PLL is calibrated. To adjust the calibration, a gain of the frequency-modulation path that is coupled to the VCO modulation input can be adjusted. Thus, the PLL calibration procedure can produce a calibration parameter that adjusts, for instance, the gain of a mixer on the frequency-modulation path that is coupled to the VCO. To perform a calibration procedure, a square wave signal is applied to the two modulation paths, with the square wave signal having a frequency of an intended peak frequency deviation. Because an error signal extracted from a filter output of the loop filter of the PLL feedback loop oscillates at the modulation rate, the negative effects of VCO flicker phase noise and ADC flicker noise is reduced as compared to other calibration approaches. Thus, efficient and accurate calibration of a gain along a frequency-modulation path advantageously manages a level of phase noise that can impact stable and accurate operation of the PLL.

FIG. 1 illustrates an example environment 100 with an electronic device 102 having a wireless interface device 120, which includes a transceiver 126 having a phase-locked loop 130 (PLL 130) and an associated signal extraction path 132 (SEP 132) for calibration of the PLL 130. In the environment 100, the example electronic device 102 communicates with a base station 104 through a wireless link 106. In FIG. 1, the electronic device 102 is depicted as a smart phone. However, the electronic device 102 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or smart watch, wireless power device (transmitter or receiver), medical device, and so forth.

The base station 104 communicates with the electronic device 102 via the wireless link 106, which may be implemented as any suitable type of wireless link that carries a communication signal. Although depicted as a base station tower of a cellular radio network, the base station 104 may represent or be implemented as another device, such as a satellite, terrestrial broadcast tower, access point, peer-to-peer device, mesh network node, fiber optic line, another electronic device as described above generally, and so forth. Hence, the electronic device 102 may communicate with the base station 104 or another device via a wired connection, a wireless connection, or a combination thereof.

The wireless link 106 extends between the electronic device 102 and the base station 104. The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard. Examples of such protocols and standards include a 3rd Generation Partnership Project Long-Term Evolution (3GPP LTE) standard, such as a Fourth Generation (4G) or a Fifth Generation (5G) cellular standard; an IEEE 802.11 standard, such as 802.11g, ac, ax, ad, aj, or ay; an IEEE 802.16 standard (e.g., WiMAX™); a Bluetooth™ standard; and so forth. In some implementations, the wireless link 106 may provide power wirelessly, and the electronic device 102 or the base station 104 may comprise a power source.

As shown, the electronic device 102 includes at least one application processor 108 and at least one computer-readable storage medium 110 (CRM 110). The application processor 108 may include any type of processor, such as a central processing unit (CPU) or a multi-core processor, that is configured to execute processor-executable instructions (e.g., code) stored by the CRM 110. The CRM 110 may include any suitable type of data storage media, such as volatile memory (e.g., random-access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus the CRM 110 does not include transitory propagating signals or carrier waves.

The electronic device 102 may also include one or more input/output ports 116 (I/O ports 116) or at least one display 118. The I/O ports 116 enable data exchanges or interaction with other devices, networks, or users. The I/O ports 116 may include serial ports (e.g., universal serial bus (USB) ports), parallel ports, audio ports, infrared (IR) ports, camera or other sensor ports, and so forth. The display 118 can be realized as a display screen or a projection that presents graphical images provided by other components of the electronic device 102, such as a user interface (UI) associated with an operating system, program, or application. Alternatively or additionally, the display 118 may be implemented as a display port or virtual interface through which graphical content of the electronic device 102 is communicated or presented.

The electronic device 102 further includes at least one wireless interface device 120 and at least one antenna 122. The wireless interface device 120 provides connectivity to respective networks and peer devices via a wireless link, which may be configured similar to or differently from the wireless link 106. Alternatively or additionally, the electronic device 102 may include a wired interface device, such as an Ethernet or fiber optic transceiver for communicating over a wired local area network (LAN), an intranet, or the Internet. The wireless interface device 120 may facilitate communication over any suitable type of wireless network, such as a wireless LAN (WLAN), wireless personal-area-network (PAN) (WPAN), peer-to-peer (P2P) network, mesh network, cellular network, wireless wide-area-network (WAN) (WWAN), and/or a navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with the base station 104 via the wireless interface device 120. However, the electronic device 102 may communicate directly with other peer devices, an alternative wireless network, and the like.

As shown, the wireless interface device 120 includes at least one communication processor 124, at least one transceiver 126, and at least one radio-frequency (RF) front-end 128 (RFFE 128). These components process data information, control information, and signals associated with communicating information for the electronic device 102 via the antenna 122. The communication processor 124 may be implemented as at least part of a system-on-chip (SoC), a modem baseband processor, or a baseband radio processor (BBP) that enables a digital communication interface for data, voice, messaging, or other applications of the electronic device 102. The communication processor 124 includes a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and other components of the wireless interface device 120 to implement various communication protocols or communication techniques.

In some cases, the application processor 108 and the communication processor 124 can be combined into one module or integrated circuit (IC), such as an SoC. Regardless, the application processor 108 or the communication processor 124 can be operably coupled to one or more other components, such as the CRM 110 or the display 118, to enable control of, or other interaction with, the various components of the electronic device 102. For example, at least one processor 108 or 124 can present one or more graphical images on a display screen implementation of the display 118 based on one or more wireless signals received via the at least one antenna 122 using components of the wireless interface device 120. Further, the application processor 108 or the communication processor 124, including a combination thereof, can be realized using digital circuitry that implements logic or functionality that is described herein. Additionally, the communication processor 124 may also include a memory (not separately shown) to store data and processor-executable instructions (e.g., code), such as a CRM 110.

The transceiver 126 can include circuitry and logic for filtering, switching, amplification, channelization, and frequency translation. Frequency translation functionality may include an up-conversion or a down-conversion of frequency that is performed in a single conversion operation (e.g., with a direct-conversion architecture), or through multiple conversion operations (e.g., with a superheterodyne architecture), using a mixer (not shown) in conjunction with the PLL 130. Generally, the transceiver 126 includes filters, switches, amplifiers, mixers, and so forth for routing and conditioning signals that are transmitted or received via the antenna 122. As shown, the transceiver 126 includes the PLL 130, the signal extraction path 132, an analog-to-digital converter 134 (ADC 134), and a digital-to-analog converter 136 (DAC 136). In operation, an analog-to-digital converter (ADC) can convert from analog signals to digital signals, and a digital-to-analog converter (DAC) can convert from digital signals to analog signals. An ADC or a DAC can be implemented as part of the communication processor 124, as part of the transceiver 126 (as shown), or separately from both of them (e.g., as another part of an SoC or as part of the application processor 108).

Figure 2:
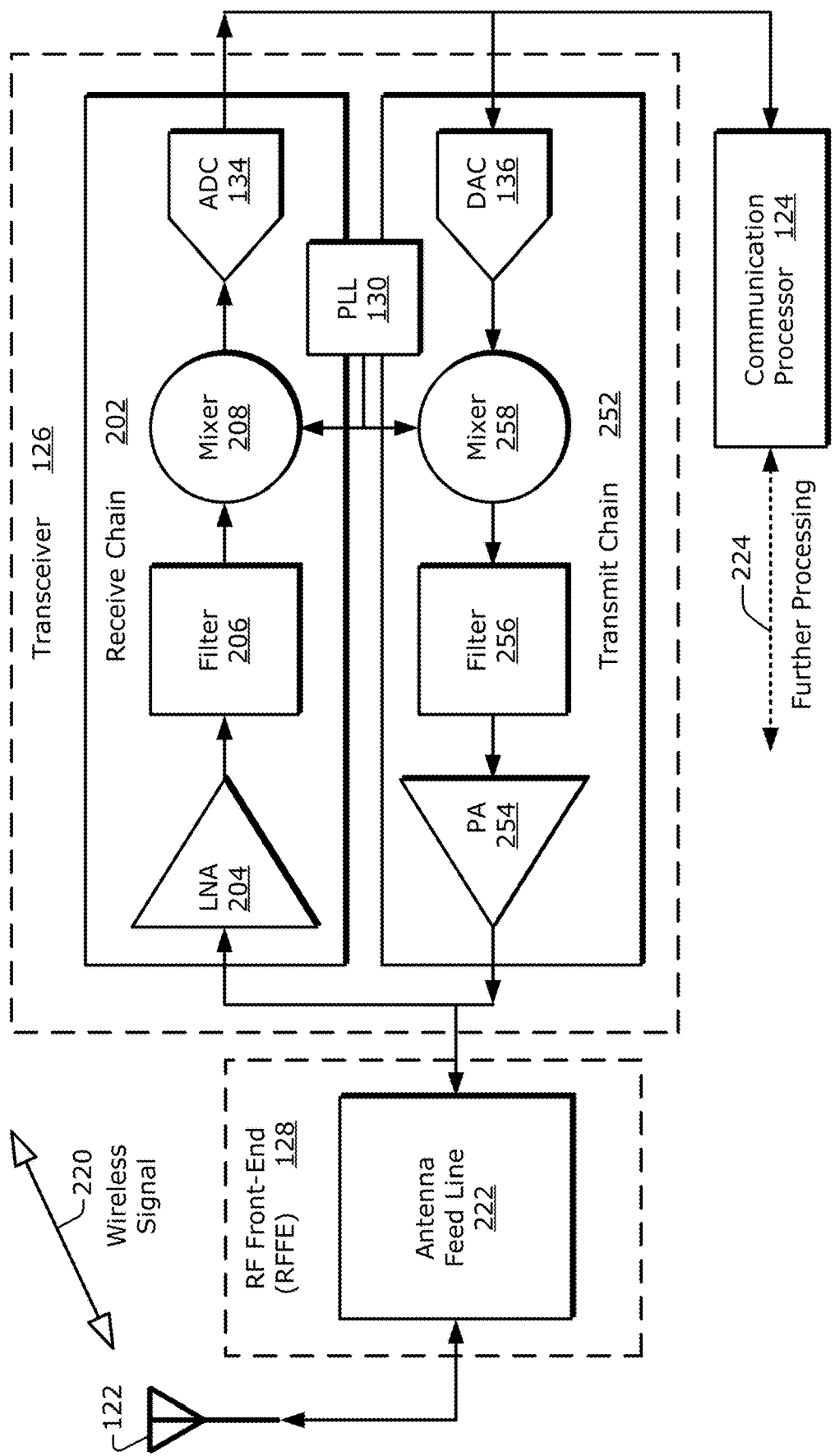
FIG. 2 illustrates an example transceiver that includes a PLL and an analog-to-digital converter (ADC) that can be used to implement PLL calibration.

The components or circuitry of the transceiver 126 can be implemented in any suitable fashion, such as with combined transceiver logic or separately as respective receiver and transceiver entities. In some cases, the transceiver 126 is implemented with multiple or different sections to implement respective receiving and transmitting operations (e.g., with separate transmit and receive chains as depicted in FIG. 2). Although not shown in FIG. 1, the transceiver 126 may also include logic to perform in-phase/quadrature (I/Q) operations, such as synthesis, phase correction, modulation, demodulation, and the like.

Generally, the RF front-end 128 includes one or more filters, switches, or amplifiers for conditioning signals received via the antenna 122 or signals to be transmitted via the antenna 122. The RF front-end 128 may include a phase shifter (PS), a peak detector, power meter, gain control block, antenna tuning circuit, diplexer, balun, and the like. Configurable components of the RF front-end 128, such as a phase shifter or automatic gain controller (AGC), may be controlled by the communication processor 124 to implement communications in various modes, with different frequency bands, or using beamforming In some implementations, the antenna 122 is implemented as at least one antenna array that includes multiple antenna elements. Thus, as used herein, an "antenna" can refer to at least one discrete or independent antenna, to at least one antenna array that includes multiple antenna elements, or to a portion of an antenna array (e.g., an antenna element), depending on context or implementation.

Although the PLL 130 and the signal extraction path 132 are depicted as being part of a transceiver 126, described implementations of either or both can alternatively be employed in other portions of the wireless interface device 120 (e.g., as part of the communication processor 124 or the RF front-end 128), or in other portions of the electronic device 102 generally. Additional aspects of the wireless interface device 120, including with regard to the PLL 130, are described below with reference to FIG. 2. Example implementations of the PLL 130 in conjunction with using the signal extraction path 132 as part of a calibration operation are described herein below, starting with FIG. 3.

FIG. 2 illustrates an example transceiver 126 that includes a PLL 130 and an ADC 134 that can be used to implement PLL calibration. At 200 generally, FIG. 2 depicts the antenna 122, the RF front-end 128, the transceiver 126, and the communication processor 124. As illustrated from left to right, the antenna 122 is coupled to the RF front-end 128, and the RF front-end 128 is coupled to the transceiver 126. The transceiver 126 is coupled to the communication processor 124. The example RF front-end 128 includes at least one antenna feed line 222. The example transceiver 126 includes at least one receive chain 202 and at least one transmit chain 252. Although only one RF front-end 128, one transceiver 126, and one communication processor 124 are shown, an electronic device 102, or a wireless interface device 120 thereof, can include multiple instances of any or all such components. Also, although only certain components are explicitly depicted in FIG. 2 and are shown coupled together in a particular manner, the transceiver 126 may include other non-illustrated components, more or fewer components, differently-coupled arrangements of components, and so forth.

In some implementations, the RF front-end 128 couples the antenna 122 to the transceiver 126 via the antenna feed line 222. In operation, the antenna feed line 222 propagates a signal between the antenna 122 and the transceiver 126. During or as part of the propagation, the antenna feed line 222 conditions the propagating signal. This enables the RF front-end 128 to couple a wireless signal 220 from the antenna 122 to the transceiver 126 as part of a reception operation. The RF front-end 128 also enables a transmission signal to be coupled from the transceiver 126 to the antenna 122 as part of a transmission operation to emanate a wireless signal 220. Although not explicitly shown in FIG. 2, an RF front-end 128, or an antenna feed line 222 thereof, may include one or more other components, such as a filter, an amplifier (e.g., a power amplifier or a low-noise amplifier), an N-plexer, and so forth.

In some implementations, the transceiver 126 can include at least one receive chain 202, at least one transmit chain 252, or both at least one receive chain 202 and at least one transmit chain 252. The receive chain 202 includes a low-noise amplifier 204 (LNA 204), a filter 206, a mixer 208 for frequency down-conversion, and the ADC 134. The transmit chain 252 includes a power amplifier 254 (PA 254), a filter 256, a mixer 258 for frequency up-conversion, and the DAC 136. However, the receive chain 202 or the transmit chain 252 can include other components—such as additional amplifiers or filters, multiple mixers, one or more buffers, or at least one local oscillator—that are electrically disposed anywhere along the depicted receive and transmit chains. The receive chain 202 is coupled between the antenna feed line 222 of the RF front-end 128 and the communication processor 124, e.g., via the low-noise amplifier 204 and the ADC 134, respectively. The transmit chain 252 is coupled between the antenna feed line 222 and the communication processor 124, e.g., via the power amplifier 254 and the DAC 136, respectively. The transceiver 126 can include at least one PLL 130, one PLL for each receive/transmit chain pair, one PLL per receive chain and one PLL per transmit chain, multiple PLLs, and so forth.

As shown for the receive chain 202, the antenna 122 is coupled to the low-noise amplifier 204 via the antenna feed line 222, and the low-noise amplifier 204 is coupled to the filter 206. The filter 206 is coupled to the mixer 208, and the mixer 208 is coupled to the ADC 134. The ADC 134 is in turn coupled to the communication processor 124. As shown for the transmit chain 252, the DAC 136 is coupled to the communication processor 124. The DAC 136 is also coupled to the mixer 258. The mixer 258 is coupled to the filter 256, and the filter 256 is coupled to the power amplifier 254. The power amplifier 254 is coupled to the antenna 122 via the antenna feed line 222. Although only one receive chain 202 and one transmit chain 252 are explicitly shown, an electronic device 102, or a transceiver 126 thereof, can include multiple instances of either or both components.

An example signal-receiving operation that includes the receive chain 202 of the transceiver 126 is now described. As part of the signal-receiving operation, the antenna 122 receives a wireless signal 220. The antenna 122 can be implemented as an individual antenna, as an antenna array, as an antenna element of an antenna array, and so forth. The antenna 122 provides the wireless signal 220 to the RF front-end 128, and the RF front-end 128 uses the antenna feed line 222 to forward the corresponding wired signal to the transceiver 126. Thus, the antenna 122 provides the wireless signal 220 to the low-noise amplifier 204 of the receive chain 202 after conditioning or other signal manipulation by the antenna feed line 222. The low-noise amplifier 204 amplifies the manipulated signal to produce an amplified signal. The low-noise amplifier 204 provides the amplified signal to the filter 206. The filter 206 filters (e.g., low-pass filters or bandpass filters) the amplified signal by attenuating some range or ranges of frequencies to produce a filtered signal that has one or more frequency bands attenuated. The filter 206 provides the filtered signal to the mixer 208.

The mixer 208 performs a frequency conversion operation on the filtered signal to down-convert from one frequency to a lower frequency, such as from a radio frequency (RF) to an intermediate frequency (IF) or to a baseband frequency (BBF). The mixer 208 can perform the frequency down conversion in a single conversion step, or through multiple conversion steps, using at least one PLL 130 that generates a signal having a synthesized frequency. Thus, the mixer 208 accepts the filtered signal and performs a frequency down-conversion operation on the filtered signal to produce a down-converted signal and provides the down-converted signal to the ADC 134. The ADC 134 converts the analog down-converted signal to a digital signal. The ADC 134 provides the digital signal to the communication processor 124. The communication processor 124 can perform demodulation, decoding, and so forth on the digital signal to produce a data signal. The communication processor 124 then provides the data signal to other components, such as the application processor 108 (of FIG. 1), for further processing at 224 (e.g., for processing at an application level).

As part of an example signal-transmitting operation that includes the transmit chain 252, the DAC 136 accepts a digital signal from the communication processor 124. The DAC 136 converts the digital signal to an analog signal, which is at a baseband frequency (BBF) or an intermediate frequency (IF). The mixer 258 accepts the analog signal from the DAC 136 and upconverts the analog signal to a higher frequency, such as an RF frequency, to produce an RF signal using a signal generated by the PLL 130 that has a target synthesized frequency. The mixer 258 provides the RF signal to the filter 256. The filter 256 filters the RF signal to attenuate one or more frequency ranges and produces a filtered signal, which the filter 256 provides to the power amplifier 254. The power amplifier 254 amplifies the filtered signal to generate an amplified signal. The power amplifier 254 provides the amplified signal to the antenna feed line 222 for signal conditioning. The RF front-end 128 provides the conditioned signal to the antenna 122 for emanation as another wireless signal 220.

Although the PLL 130 is depicted in FIG. 2 as being part of a transceiver 126 to support frequency translation operations of at least one receive or transmit chain, a PLL 130 can be deployed in other portions of an electronic device, used in other manners or to provide other functionality, coupled to different components, and so forth. Many such implementations for a PLL 130 can benefit from efficient calibration procedures that are enabled by the example PLL calibration architectures that are described herein.

Figure 3:
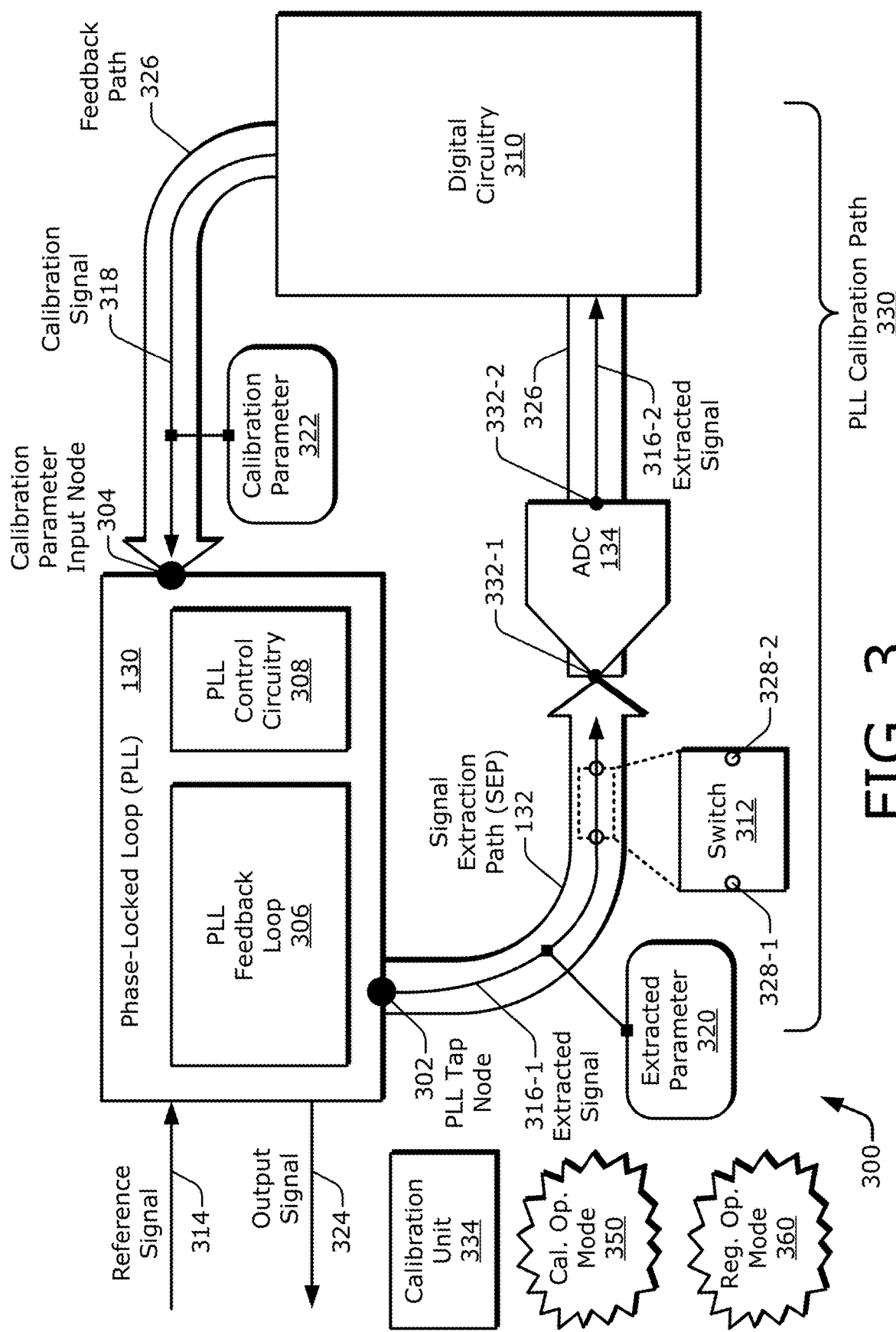
FIG. 3 illustrates an example architecture for PLL calibration that includes a PLL and a PLL calibration path, which calibration path includes a signal extraction path and a feedback path.

FIG. 3 illustrates an example architecture 300 for PLL calibration that includes a PLL 130 and a PLL calibration path 330. The PLL calibration path 330 includes a signal extraction path 132 and a feedback path 326. As shown, the PLL 130 includes a PLL tap node 302, a calibration parameter input node 304, a PLL feedback loop 306, and PLL control circuitry 308. In operation, the PLL 130 accepts a reference signal 314 and produces an output signal 324 based on the reference signal 314. The PLL 130 can operate in one of at least two modes at different times: a calibration operational mode 350 or a regular operational mode 360. In the regular operational mode 360, the PLL 130 is performing or supporting some function by providing the output signal 324 at some target frequency. In the calibration operational mode 350, the PLL 130 is being calibrated to meet at least one criterion by adjusting an operational parameter of the PLL feedback loop 306 or the PLL control circuitry 308. Acts performed to calibrate the PLL 130 may be initiated or orchestrated by a calibration unit 334.

In example implementations, the PLL calibration path 330 is coupled between the PLL tap node 302 and the calibration parameter input node 304. The signal extraction path 132 of the PLL calibration path 330 includes at least one switch 312. The switch 312 includes at least two terminals: a first terminal 328-1 and a second terminal 328-2. Each terminal 328 can be realized as, for example, a pole or a throw of the switch 312. The feedback path 326 of the PLL calibration path 330 includes an ADC 134 and digital circuitry 310. The ADC 134 may be part of a receive chain 202 (e.g., of FIG. 2), may be dedicated to PLL calibration, may be part of another portion or functionality of a wireless interface device 120 (e.g., of FIG. 1 or 2) or another component of an electronic device 102 (e.g., of FIG. 1), and so forth. The ADC 134 includes two ADC nodes: an ADC input node 332-1 and an ADC output node 332-2.

The digital circuitry 310 may be part of an application processor 108 (e.g., of FIG. 1), may be part of a communication processor 124 (e.g., of FIG. 1 or 2), may be part of a transceiver 126 (e.g., of FIG. 1 or 2), may include digital components or devices that are dedicated to PLL calibration, may be realized with other signal-processing hardware, some combination thereof, and so forth. The calibration unit 334 can be implemented as part of, for example, the digital circuitry 310 or the communication processor 124. Also, although the PLL control circuitry 308 is depicted separately from the digital circuitry 310, at least a portion of the PLL control circuitry 308 can be implemented as part of the digital circuitry 310 or as part of other digital circuitry. An example of this is described below with reference to FIGS. 7-1 and 7-2.

As illustrated, the signal extraction path 132 is coupled to the PLL tap node 302, and the feedback path 326 is coupled to the calibration parameter input node 304. The first terminal 328-1 of the switch 312 is coupled to the PLL tap node 302, and the second terminal 328-2 of the switch 312 is coupled to the ADC input node 332-1. With these couplings, the at least one switch 312 is coupled between the PLL tap node 302 and the ADC input node 332-1. The ADC output node 332-2 is coupled to the digital circuitry 310, and the digital circuitry 310 is coupled to the calibration parameter input node 304. Thus, the digital circuitry 310 is coupled between the ADC 134 and the calibration parameter input node 304 of the PLL 130.

In some implementations, the signal extraction path 132 is configured to extract an extracted signal 316 from the PLL tap node 302 of the PLL 130 responsive to the at least one switch 312 being in a closed state. In these manners, the signal extraction path 132 provides a mechanism for extracting the extracted signal 316 from the PLL 130 via the PLL tap node 302. The calibration unit 334 can close the switch 312 responsive to entering the calibration operational mode 350. The extracted signal 316 includes, is associated with, or carries an extracted parameter 320 that may correspond to a current operational characteristic of the PLL 130. As the extracted signal 316 propagates along at least part of the signal extraction path 132, the extracted signal 316 is realized as an analog extracted signal 316-1. The switch 312 couples the analog extracted signal 316-1 to the ADC input node 332-1 of the ADC 134. The ADC 134 converts the analog extracted signal 316-1 to a digital extracted signal 316-2. The ADC 134 forwards the digital extracted signal 316-2 from the ADC output node 332-2 along the feedback path 326 to the digital circuitry 310. The digital circuitry 310 accepts the digital extracted signal 316-2 and produces a calibration signal 318 based on the digital extracted signal 316-2. The calibration signal 318 includes, is associated with, or carries a calibration parameter 322. The digital circuitry 310 provides the calibration signal 318 to the PLL 130 via the calibration parameter input node 304.

The PLL 130 can operate responsive to the calibration signal 318, such as by operating based on the calibration parameter 322. Thus, an example calibration process flows from the PLL tap node 302 with the extracted signal 316, over the switch 312, across the ADC 134, through the digital circuitry 310, and to the calibration parameter input node 304 with the calibration signal 318. Examples of a calibration signal 318 and a calibration parameter 322 are described below with reference to two example implementation or usage scenarios respectively depicted in FIGS. 6 and 7-1. Additional general aspects of example calibration procedures are described below with reference to FIG. 5. And operation of an example PLL feedback loop 306 of a PLL 130, including with regard to the reference signal 314 and the output signal 324, is described next with reference to FIG. 4.

Figure 4:
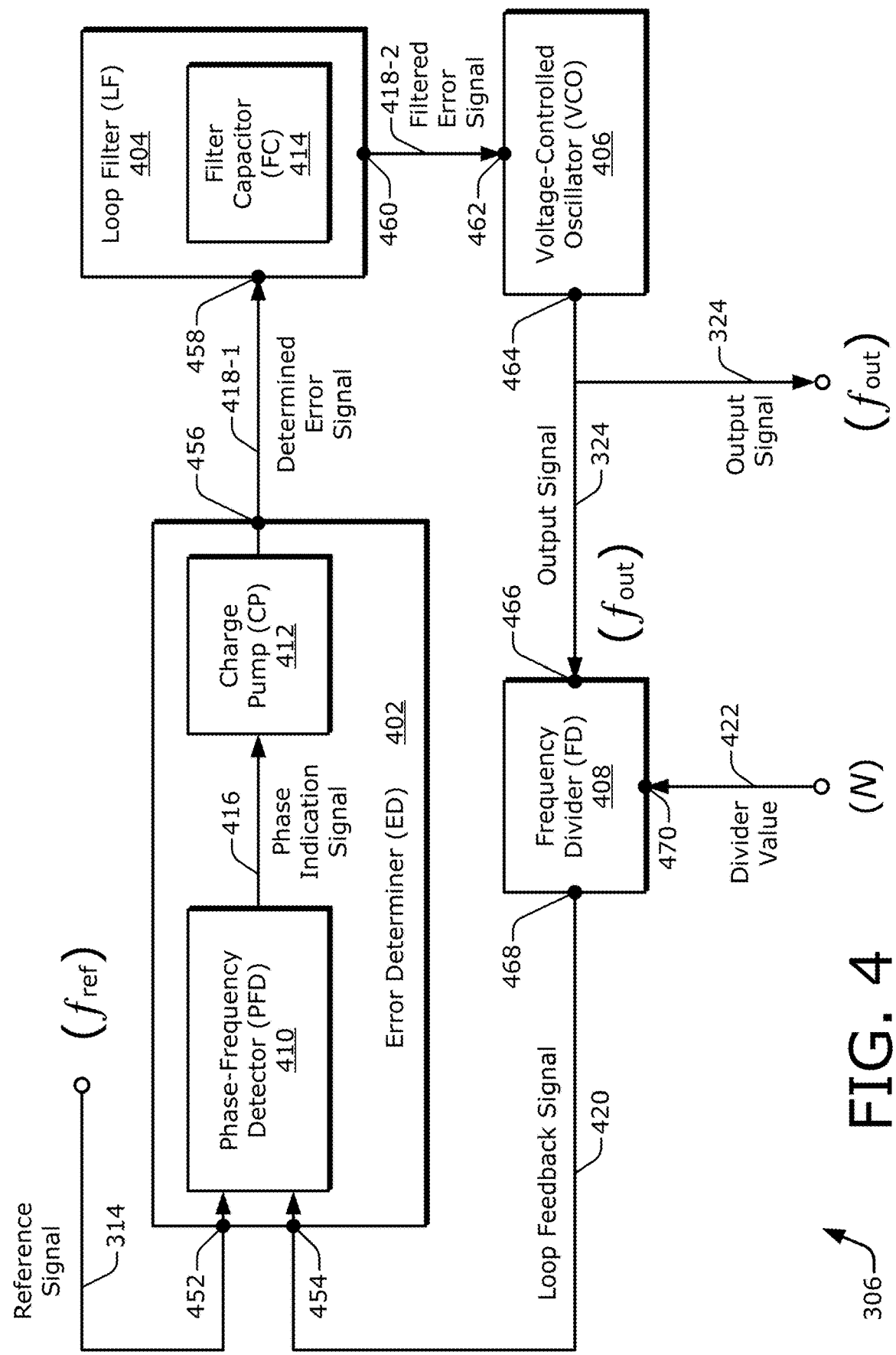
FIG. 4 illustrates an example phase-locked loop (PLL) that includes an error determiner, a loop filter, a voltage-controlled oscillator (VCO), and a frequency divider.

FIG. 4 illustrates an example PLL feedback loop 306 of a PLL 130 (e.g., of FIG. 3). The PLL feedback loop 306 includes an error determiner 402 (ED 402), a loop filter 404 (LF 404), a voltage-controlled oscillator 406 (VCO 406), and a frequency divider 408 (FD 408). As shown, the error determiner 402 may include a phase-frequency detector 410 (PFD 410) and a charge pump 412 (CP 412), and the loop filter 404 may have a filter capacitor 414 (FC 414). With reference also to FIG. 3, certain example inputs and outputs are indicated in FIG. 4. These include the reference signal 314 with a reference frequency $f_{ref}$ and the output signal 324 with an output frequency $f_{out}$. Also, a control input node 470 of the frequency divider 408 receives a divider value 422, which can be realized as a modulus value N.

As shown, the error determiner 402 is coupled to the loop filter 404. The loop filter 404 is coupled to the VCO 406, and the VCO 406 is coupled to the frequency divider 408. To close or complete a signal propagation path of the PLL feedback loop 306, the frequency divider 408 is coupled to the error determiner 402. As part of the error determiner 402 in some implementations, the phase-frequency detector 410 is coupled to the charge pump 412, and the charge pump 412 is coupled to the loop filter 404.

The error determiner 402 includes a reference input node 452 and a feedback input node 454. The reference input node 452 accepts the reference signal 314. The error determiner 402 also includes an error output node 456. The loop filter 404 includes a filter input node 458 and a filter output node 460. The error output node 456 is coupled to the filter input node 458. The VCO 406 includes a VCO input node 462 and a VCO output node 464. The filter output node 460 is coupled to the VCO input node 462. The frequency divider 408 includes a frequency divider (FD) input node 466 and an FD output node 468. The VCO output node 464 is coupled to the FD input node 466, and the FD output node 468 is coupled to the feedback input node 454. Thus, the frequency divider 408 is coupled between the VCO output node 464 of the VCO 406 and the feedback input node 454 of the error determiner 402.

In example implementations, the PLL feedback loop 306 of the PLL 130 utilizes a negative feedback path as part of the signal propagation loop. The following description of the PLL feedback loop 306 starts at the top-left corner of FIG. 4 at the phase-frequency detector 410 and continues in a clockwise direction. The phase-frequency detector 410 accepts the reference signal 314 and a loop feedback signal 420. From the phase-frequency detector 410, signal flow of the PLL feedback loop 306 continues to the charge pump 412. From the charge pump 412, the signal flow extends to the loop filter 404. More specifically, the error determiner 402 produces an error signal 418, and the loop filter 404 provides a version of the error signal 418 to the VCO 406. The VCO 406 produces the output signal 324 based on the error signal version that is accepted from the loop filter 404. The output signal 324 is also fed back to the phase-frequency detector 410, via the frequency divider 408, as part of the PLL feedback pathway that includes the loop feedback signal 420.

In an example operation, the phase-frequency detector 410 produces a phase indication signal 416 based on a phase difference between the reference signal 314 and the loop feedback signal 420. The charge pump 412 accepts the phase indication signal 416, which is indicative of the phase difference, and converts the phase indication signal 416 to a determined error signal 418-1, which may be realized as a charge signal. The charge pump 412 of the error determiner 402 provides the determined error signal 418-1 to the loop filter 404 via the error output node 456 and the filter input node 458. Thus, the charge from the determined error signal 418-1 is applied to the filter capacitor 414 of the loop filter 404. This applied charge can increase or decrease a voltage level associated with the filter capacitor 414. The voltage level of the filter capacitor 414 can serve as a, e.g., voltage-based version of a filtered error signal 418-2. In effect, the loop filter 404 uses the filter capacitor 414 to integrate the charge in the determined error signal 418-1 by charging the filter capacitor 414 (e.g., in which charging can include adding charge to or removing charge from the filter capacitor 414). The loop filter 404 can also perform lowpass filtering as part of the operation to generate the voltage-based filtered error signal 418-2.

The loop filter 404 provides the filtered error signal 418-2 to the VCO 406 via the filter output node 460 and the VCO input node 462. The VCO 406 functions as an oscillator having a frequency that is proportional to a magnitude of the filtered error signal 418-2. Hence, the VCO 406 produces an oscillating signal as the output signal 324 based on the filtered error signal 418-2 obtained from the loop filter 404. Thus, this oscillating signal can represent the output signal 324 of the PLL 130 (e.g., of FIGS. 3 and 5). This oscillating signal is also used to continue the PLL feedback loop 306. Accordingly, the output signal 324 can be fed directly back to the phase-frequency detector 410 without modification (e.g., where the loop feedback signal 420 comprises an unmodified version of the output signal 324). However, as illustrated in FIG. 4, the VCO 406 can instead provide the output signal 324 to the frequency divider 408 via the VCO output node 464 and the FD input node 466. The frequency divider 408 generates the loop feedback signal 420 based on the output signal 324 and the divider value 422, which can be fixed or adjustable. The frequency divider 408 provides the loop feedback signal 420 to the phase-frequency detector 410 via the FD output node 468 and the feedback input node 454 to complete the feedback loop of the PLL.

Figure 5:
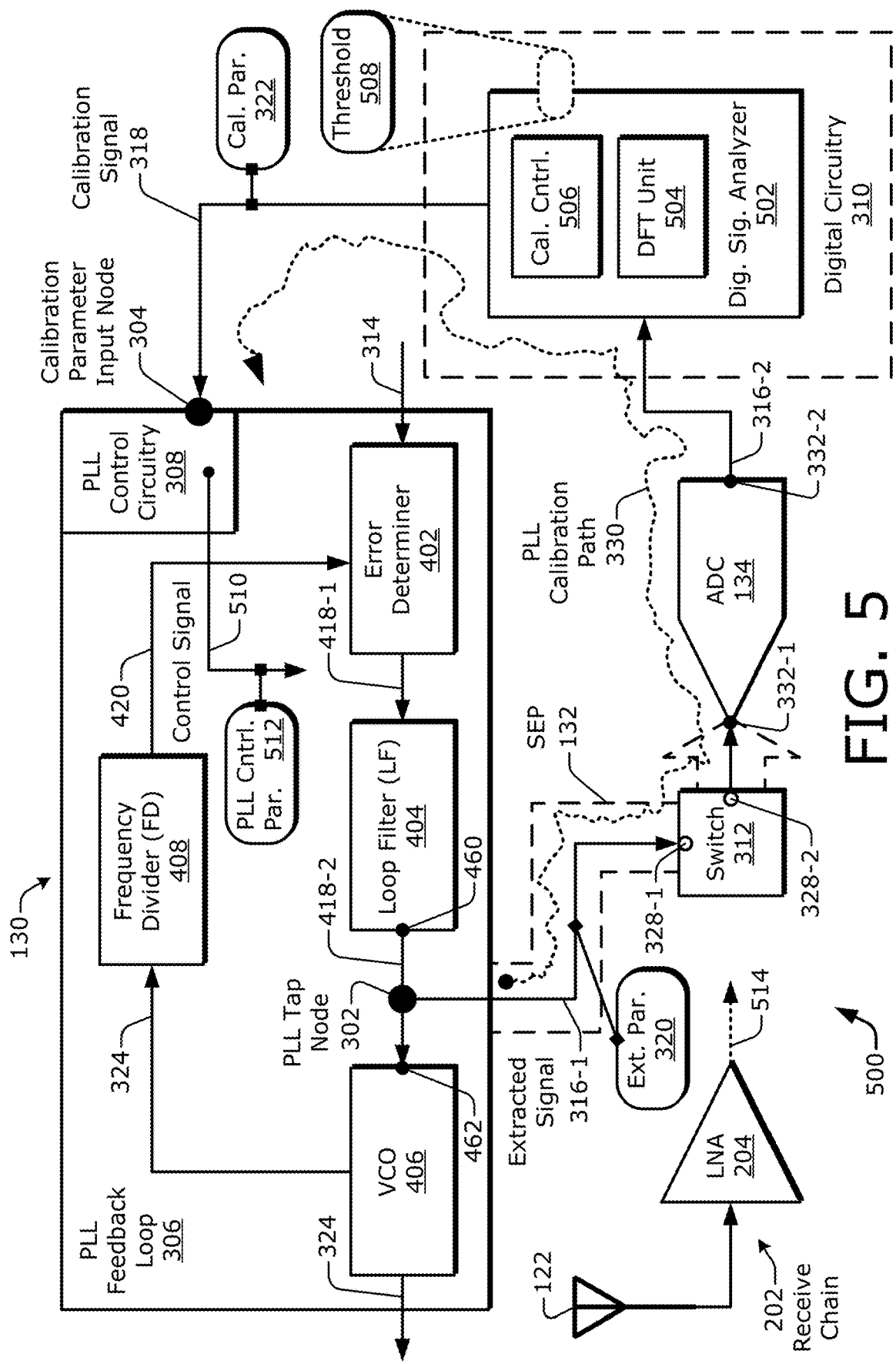
FIG. 5 illustrates an example architecture for PLL calibration in which digital circuitry produces a calibration signal based on a signal that is extracted from the PLL and routed through an ADC.

FIG. 5 illustrates an example PLL calibration architecture 500 in which digital circuitry 310 produces a calibration signal 318 based on a signal that is extracted from a PLL 130 and routed through an ADC 134. The PLL 130 includes a PLL feedback loop 306 and PLL control circuitry 308. The PLL feedback loop 306 includes an error determiner 402, a loop filter 404, a VCO 406, and a frequency divider 408. The PLL feedback loop 306 also includes a PLL tap node 302. For example, the PLL tap node 302 can be coupled between the loop filter 404 and the VCO 406. As shown, the PLL tap node 302 is electrically positioned between the filter output node 460 and the VCO input node 462. Thus, an error signal 418 can be accessed or obtained via the PLL tap node 302. More specifically, a filtered error signal 418-2 can be extracted via the PLL tap node 302. The PLL control circuitry 308 includes a calibration parameter input node 304.

In some implementations, a PLL calibration path 330 extends from the PLL tap node 302 to the calibration parameter input node 304. In operation, the at least one switch 312, responsive to being in a closed state, routes a signal from the filter output node 460, via the PLL tap node 302, toward an ADC input node 332-1 of the ADC 134. In this instance, the switch 312 routes the filtered error signal 418-2 as the extracted signal 316 from the PLL tap node 302 and across a first terminal 328-1 and a second terminal 328-2 of the switch 312 responsive to the switch 312 being in a closed state. A signal extraction path 132 (SEP 132) provides the extracted signal 316, which includes an extracted parameter 320, to the ADC input node 332-1 using the switch 312. The extracted parameter 320 can comprise, for example, an analog voltage corresponding to the filtered error signal 418-2.

Figure 6:
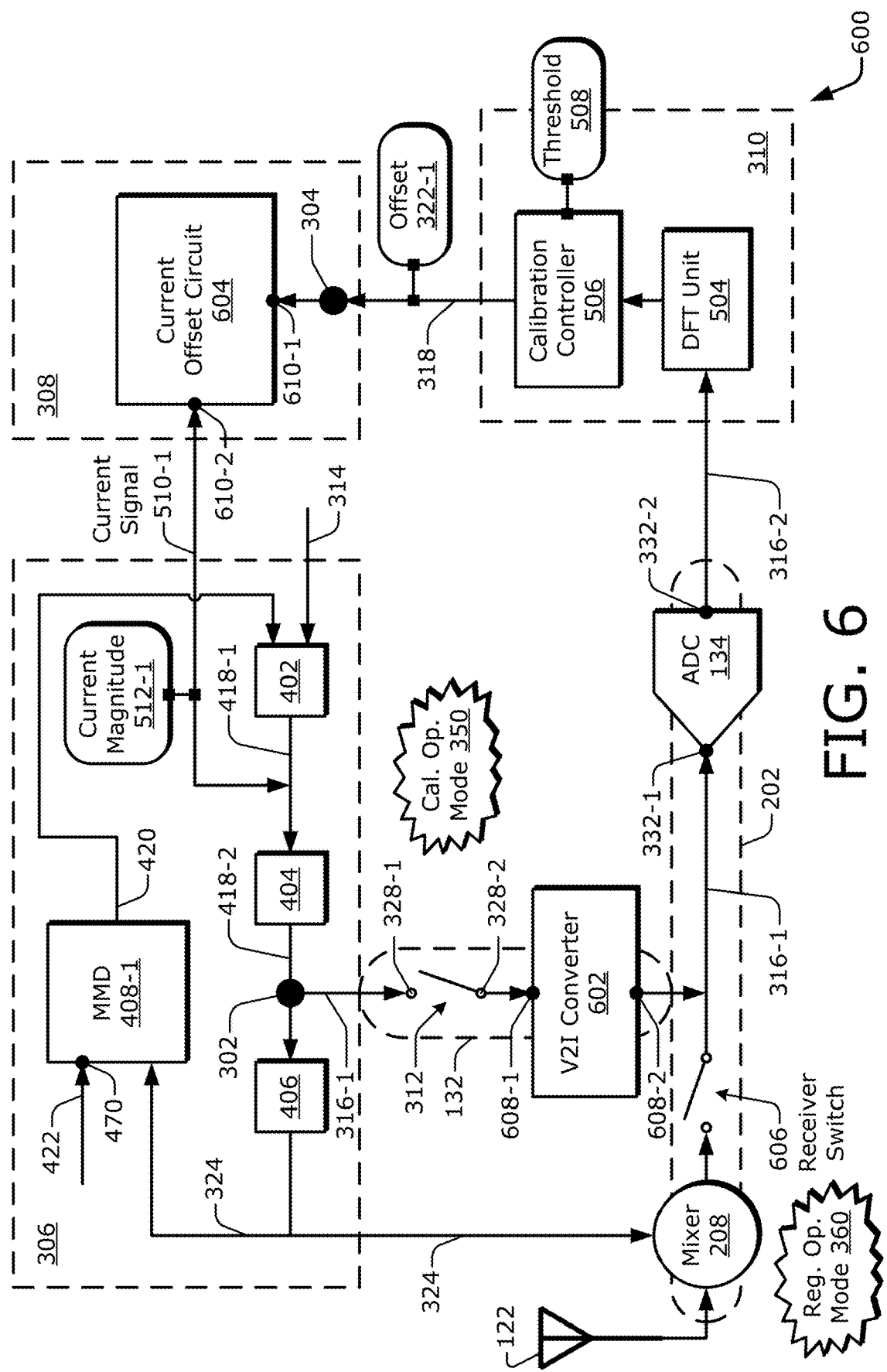
FIG. 6 illustrates an example PLL calibration architecture in which the calibration signal is provided to a current offset circuit of PLL control circuitry.

FIG. 5 also depicts an antenna 122 coupled to a receive chain 202, which includes an LNA 204. As represented by the dashed arrow 514, the LNA 204 can be switchably coupled to the ADC 134, and the ADC 134 can be used to convert amplified signals as part of a reception of a wireless signal. Thus, in some implementations, the ADC 134 can be part of the receive chain 202, such as by being operably coupled to the antenna 122 (e.g., via a receiver switch in a closed state as depicted in FIG. 6). In these manners, an ADC 134 or other portion of a receive path 202 (e.g., a DFT unit 504) that can be selectively employed for PLL calibration and wireless signal reception at different times or for different operational modes provides a mechanism for sharing a portion of a receive path 202 to process the extracted signal 316 as part of a PLL calibration procedure. Regardless, the ADC 134 accepts an analog extracted signal 316-1 from the second terminal 328-1 of the switch 312 at the ADC input node 332-1. After conversion, the ADC 134 provides a digital extracted signal 316-2 to the digital circuitry 310 via an ADC output node 332-2.

As shown, the digital circuitry 310 includes a digital signal analyzer 502 (dig. sig. analyzer 502). Generally, the digital signal analyzer 502 generates the calibration signal 318 responsive to the digital extracted signal 316-2. An analysis performed by the digital signal analyzer 502 can further be based on at least one threshold 508. The digital signal analyzer 502 includes a discrete Fourier transform (DFT) unit 504 (DFT unit 504) and a calibration controller 506. The calibration controller 506 can include or otherwise have access to the at least one threshold 508. The calibration controller 506 can interoperate with, be integrated as a part of, or include the calibration unit 334 (of FIG. 3). In operation, the DFT unit 504 performs a DFT operation on the digital extracted signal 316-2 to determine multiple components of the digital extracted signal 316-2 at respective ones of multiple frequencies (e.g., determines multiple frequency components). The calibration controller 506 ascertains a magnitude of a selected frequency component that corresponds to a frequency that is relevant to the PLL calibration procedure. Examples of relevant frequencies for a given PLL calibration procedure are described below with reference to FIGS. 6 and 7-1. To use circuit resources efficiently, the digital signal analyzer 502, or a portion thereof (e.g., the DFT unit 504), can be employed for signal processing operations during a regular operational mode 360, such as for the processing of a received signal as part of a receiver path that includes the receive chain 202.

In some implementations, the ascertained magnitude of the selected frequency component is compared to the threshold 508. Examples of the threshold 508 include a zero value, a minimum acceptable value, a maximum permitted value, one or more previously-ascertained magnitudes (e.g., to check progress or use a percentage-based threshold), and so forth. Based on the comparison, the calibration controller 506 determines an updated calibration parameter 322 to control operation of the PLL 130. The calibration controller 506 provides the calibration signal 318, which includes the calibration parameter 322, to the PLL control circuitry 308 via the calibration parameter input node 304. Examples of the calibration parameter 322 for a given PLL are described below with reference to FIGS. 6 and 7-1.

Based on the calibration parameter 322 of the calibration signal 318, the PLL control circuitry 308 generates a control signal 510. The control signal 510 includes, is associated with, or carries a PLL control parameter 512 (PLL cntrl. par. 512). The PLL control circuitry 308 provides the control signal 510 with an updated PLL control parameter 512 to the PLL feedback loop 306 to control operation of the PLL 130. This updated PLL control parameter 512 affects the filtered error signal 418-2 at the PLL tap node 302. In this manner, the PLL calibration procedure can continue with multiple iterations along the PLL calibration path 330 until a targeted performance is achieved relative to a given threshold 508 or other criterion. In an example usage scenario, the PLL control parameter 512 is realized as a current magnitude that is applied to a PLL feedback loop 306 by PLL control circuitry 308. This example usage scenario is described with reference to FIG. 6. In another example usage scenario, the PLL control parameter 512 is realized as a modulation frequency (MF) that is applied to a PLL feedback loop 306 by PLL control circuitry 308. This example usage scenario is described with reference to FIGS. 7-1 to 7-3.

FIG. 6 illustrates an example PLL calibration architecture 600 in which the calibration signal 318 is provided to a current offset circuit 604 of the PLL control circuitry 308. As is described below, the PLL feedback loop 306 includes a multi-modulus divider (MMD) 408-1 coupled between the VCO 406 and the error determiner 402 to function as a frequency divider 408. In some usage scenarios, an output signal of a PLL can be provided to a mixer to facilitate frequency translation—e.g., frequency up-conversion or frequency down-conversion. As shown, the output signal 324 of the PLL feedback loop 306 is provided to a mixer 208, which is coupled to the antenna 122. The mixer 208 is part of a receive chain 202. In this example, the receive chain 202 includes a receiver switch 606 and an ADC 134 such that the ADC 134 can be shared between a receive path and a PLL calibration path 330 (e.g., of FIGS. 3 and 5).

The receiver switch 606 is depicted as being coupled between the mixer 208 and the ADC input node 332-1 of the ADC 134. However, the receiver switch 606 can be coupled instead between the antenna 122 and the mixer 208. Regardless, the receiver switch 606 is coupled between the antenna 122 and the ADC input node 332-1. The receiver switch 606 selectively enables wireless signal reception via the antenna 122 and the ADC 134 responsive to the receiver switch 606 being in a closed state. Thus, the receiver switch 606 is in a closed state for the regular operational mode 360 and is in an open state for the calibration operational mode 350.

To receive a wireless signal in the regular operational mode 360, the mixer 208 performs a frequency translation operation—frequency down-conversion. Here, a target output frequency of the output signal 324 is based on a desired frequency down-conversion. To establish the target output frequency, a particular divider value 422 is applied to a frequency divider (e.g., the frequency divider 408 of FIG. 4) of the PLL feedback loop 306. In this example implementation, the frequency divider 408 is realized as a multi-modulus divider 408-1 (MMD 408-1) that can be driven by a sigma-delta modulator (ΣΔ-modulator) (not shown in FIG. 6). With a multi-modulus divider 408-1, the PLL feedback loop 306 generates an undesirable spur at a frequency that is dependent on the divider value 422.

Fortunately, the spur can be reduced by employing a current offset circuit 604 that applies current to the PLL feedback loop 306 to shift operation of the error determiner 402 into a linear region. The act of injecting current, however, can produce noise. Further, the noise increases as the amount of current being injected increases. Accordingly, it is beneficial to apply a sufficient amount of current to manage the spur produced by the multi-modulus divider 408-1 without applying an excess amount of current. Advantageously, the PLL calibration implementations described herein can be employed to control how much current is applied to the PLL feedback loop 306 based on a size of the spur generated by the divider value 422 that is provided to the multi-modulus divider 408-1. Example calibration procedures for this are described with reference to FIG. 6.

In the example scenario of FIG. 6, the calibration parameter 322 (e.g., of FIGS. 3 and 5) of the calibration signal 318 is realized as an offset 322-1 that indicates to the current offset circuit 604 of the PLL control circuitry 308 an amount of current offset to provide to the PLL feedback loop 306. The control signal 510 (e.g., of FIG. 5) that includes the PLL control parameter 512 is realized as a current signal 510-1 that includes a current magnitude 512-1. The current offset circuit 604 can be implemented as, for instance, an offset digital-to-analog converter (DAC) (offset DAC) (not explicitly shown). The current offset circuit 604 includes an offset circuit (OC) input node 610-1 and an OC output node 610-2.

Generally, the current offset circuit 604 applies a current signal 510-1 to the PLL feedback loop 306; this can shift operation of the error determiner 402 into a linear region. The digital circuitry 310 adjusts a current magnitude 512-1 of the current signal 510-1 that is applied by the current offset circuit 604 based on the extracted signal 316. More specifically, the digital circuitry 310 adjusts the current magnitude 512-1 of the current signal 510-1 that is applied by the current offset circuit 604 responsive to a magnitude of a spur corresponding to at least one frequency component of the extracted signal 316. The frequency component is isolated by the DFT unit 504, and the relevant frequency of the frequency component is calculated based on the divider value 422 that is provided to the multi-modulus divider 408-1. In these manners, the components of the PLL calibration architecture 600 that correspond to the feedback path 326 (e.g., of FIG. 3) provide a mechanism for adjusting a current magnitude 512-1 of a current signal 510-1 applied to a PLL feedback loop 306 of the PLL 130 based on the extracted signal 316 to calibrate the PLL 130.

In example implementations, the signal extraction path 132 includes the switch 312 having a first terminal 328-1 and a second terminal 328-2. In the regular operational mode 360, the switch 312 is in an open state. For the calibration operational mode 350, on the other hand, the switch 312 is placed in a closed state. With the switch 312 in the closed state, the signal extraction path 132 extracts the filtered error signal 418-2 via the PLL tap node 302 as an analog extracted signal 316-1. The filtered error signal 418-2 includes at least one spur at a frequency component determined by the divider value 422 and referred to herein as an "MMD-induced spur."

The signal extraction path 132 can include a buffer in addition to the switch 312. The buffer can pass the signal as-is, can strengthen the signal, can convert the signal from being voltage-based to being current-based, and so forth. In this example, the ADC 134 is current-based. Thus, to accommodate the input specifications of the current-based ADC 134, the buffer of the signal extraction path 132 is implemented as a voltage-to-current (V2I) converter 602 (V2I converter 602). The V2I converter 602 includes a V2I-converter input node 608-1 and a V2I-converter output node 608-2.

The switch 312 or the voltage-to-current converter 602 (V2I converter 602) may be coupled closer to the PLL tap node 302. As shown, the V2I-converter input node 608-1 is coupled to the PLL tap node 302 via the switch 312, and the V2I-converter output node 608-2 is coupled to the ADC input node 332-1. The V2I converter 602 is therefore coupled in series with the at least one switch 312 (in any order) between the PLL tap node 302 and the ADC input node 332-1. In operation, the V2I converter 602 converts a signal from being voltage-based at the V2I-converter input node 608-1 to being current-based at the V2I-converter output node 608-2. With the V2I converter 602, the analog extracted signal 316-1 comprises a voltage-based signal as extracted from the PLL tap node 302, and the analog extracted signal 316-1 comprises a current-based signal between the V2I-converter output node 608-2 and the ADC input node 332-1.

The ADC 134 converts the analog extracted signal 316-1 to a digital extracted signal 316-2. The digital extracted signal 316-2, which includes the MMD-induced spur, is provided to the DFT unit 504. The DFT unit 504 performs a DFT operation on the digital extracted signal 316-2 to isolate various frequency components. The calibration controller 506 ascertains the frequency component corresponding to the MMD-induced spur. The calibration controller 506 compares the ascertained frequency component to at least one threshold 508. The threshold 508 can be implemented as, for example, an acceptable maximum spur magnitude or a lowest spur magnitude measured thus far in the PLL calibration procedure. The calibration controller 506 selects another offset 322-1 for measuring a magnitude of the MMD-induced spur. The PLL calibration procedure can continue as the calibration controller 506 sweeps the current offset circuit 604 through each available offset or until a suitable offset is determined (e.g., because a spur is below a maximum acceptable magnitude).

Continuing with a description of the PLL calibration path 330 (e.g., of FIGS. 3 and 5), the calibration controller 506 couples the calibration signal 318 to the current offset circuit 604 via the calibration parameter input node 304 and the OC input node 610-1 to provide the offset 322-1 to the PLL control circuitry 308. The OC input node 610-1 and the calibration parameter input node 304 may be co-located with one another. Based on the offset 322-1, the current offset circuit 604 determines an updated current magnitude 512-1 for this round of calibration measurement and analysis. The current offset circuit 604 applies the current signal 510-1 having the updated current magnitude 512-1 to the PLL feedback loop 306 via the OC output node 610-2. For example, the current offset circuit 604 can apply the current signal 510-1 to the determined error signal 418-1. With reference to FIG. 4, the current offset circuit 604 can apply the current signal 510-1 before, after, or to the charge pump 412 of the error determiner 402. As indicated by the two-way arrow representing the current signal 510-1, the application of the current signal 510-1 can include injecting charge (e.g., applying a positive current) or withdrawing charge (e.g., applying a negative current) at the current magnitude 512-1.

Figures 1, 7:
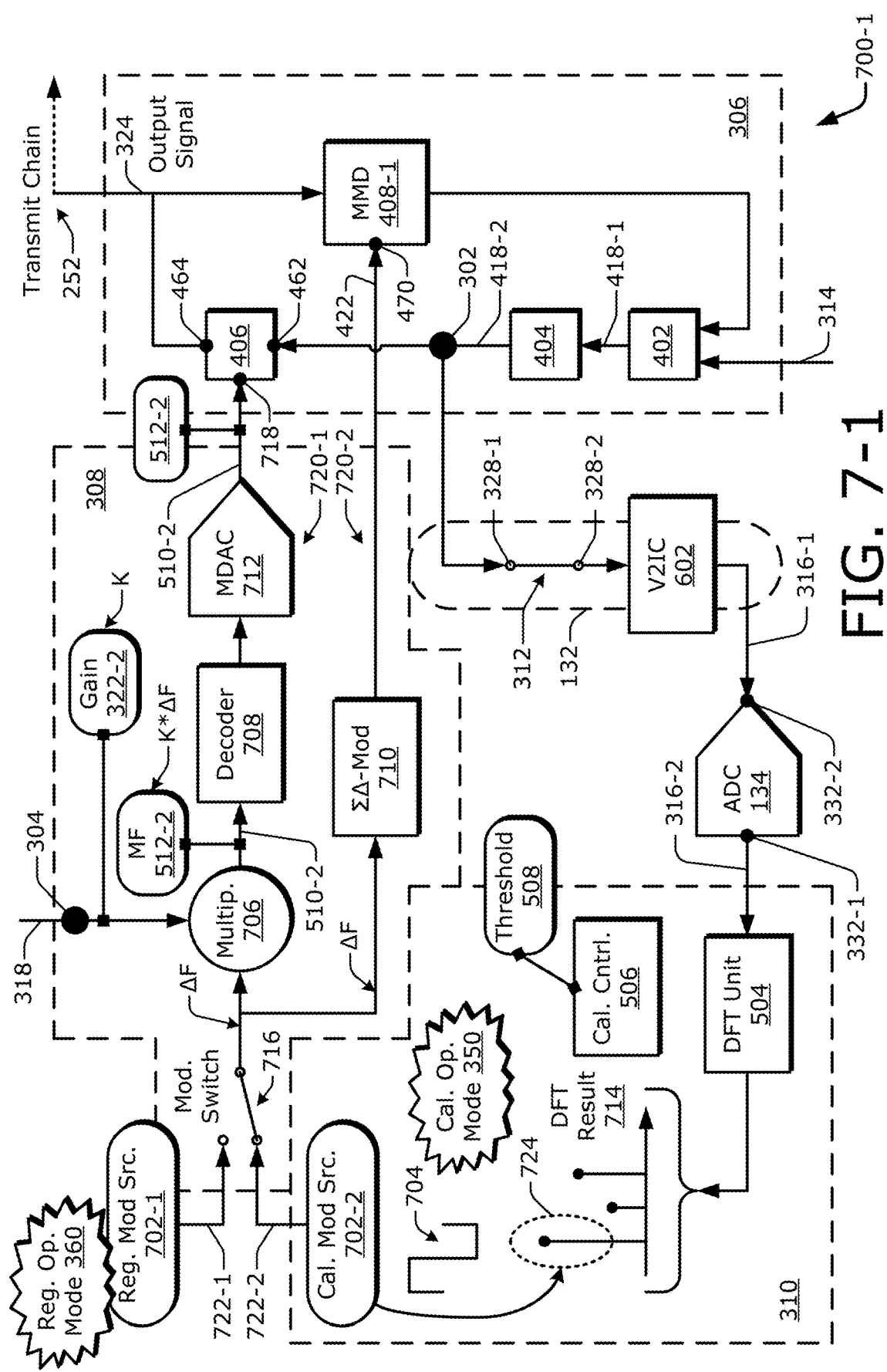
Figures 2, 7:
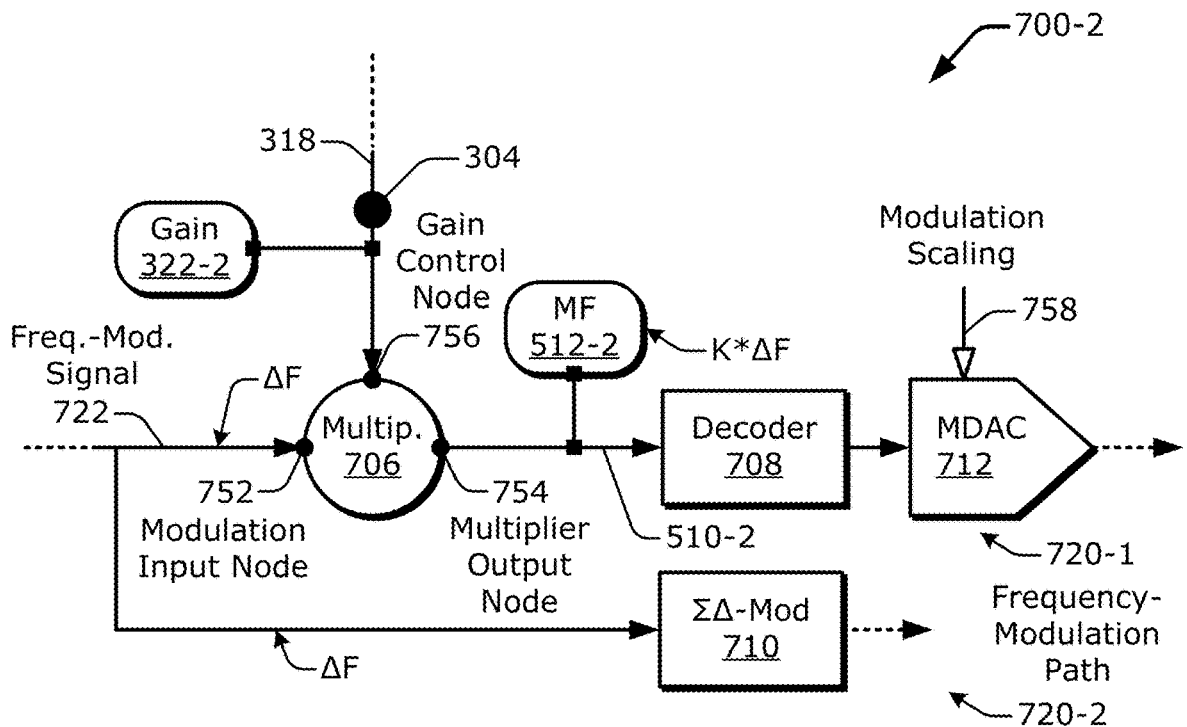
Figures 3, 7:
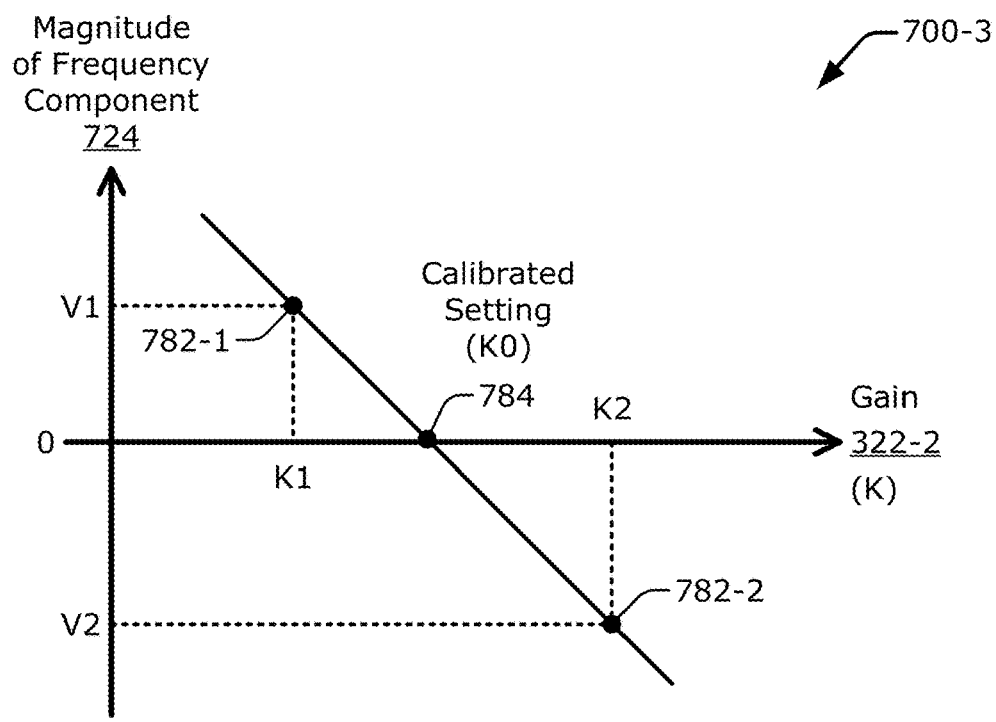

FIG. 7-1 illustrates an example PLL calibration architecture 700-1 in which the calibration signal 318 is applied to a frequency-modulation path 720-1 of PLL control circuitry 308. As is described below, modulation is applied to a signal for wireless propagation using two frequency-modulation paths of the PLL control circuitry 308: a first frequency-modulation path 720-1 and a second frequency-modulation path 720-2. As illustrated, the first frequency-modulation path 720-1 of the PLL control circuitry 308 includes a multiplier 706, a decoder 708, and a modulation DAC 712 (MDAC 712). The second frequency-modulation path 720-2 of the PLL control circuitry 308 includes a sigma-delta modulator 710 (ΣΔ-mod 710). The PLL control circuitry 308 also includes a modulation switch 716 and the calibration parameter input node 304. The PLL control circuitry 308 of FIG. 7-1 can be implemented at least partially using digital circuitry (e.g., digital circuitry can be used at least "prior" to the modulation DAC 712, such as for the multiplier 706 or the sigma-delta modulator 710).

In some usage scenarios, a multi-point modulated PLL, such as a two-point modulated PLL, is used to apply modulation to a signal for communication as a wireless signal. As shown, the PLL feedback loop 306 accepts modulation via a VCO modulation input node 718 of the VCO 406 and via the control input node 470 of the multi-modulus divider 408-1. In this example, the first frequency-modulation path 720-1 provides a first frequency-modulated signal to the VCO modulation input node 718 of the VCO 406, and the second frequency-modulation path 720-2 provides a second frequency-modulated signal to the control input node 470 of the multi-modulus divider 408-1.

In the regular operational mode 360, the modulation applied at the VCO 406 and the modulation applied at the multi-modulus divider 408-1 are intended to match each other so as to counterbalance their respective effects on the PLL 130. In this manner, modulation applied via the VCO modulation input node 718 is counterbalanced by modulation applied by the divider value 422 via the control input node 470 such that the PLL feedback loop 306 remains stable without involving an appreciable change to the error signal 418. This balancing can be achieved through a PLL calibration procedure that adjusts a gain of the multiplier 706 of the PLL control circuitry 308.

A frequency-modulation signal 722 is coupled to both of the first and second frequency-modulation paths 720-1 and 720-2 via the modulation switch 716 as represented by the delta-frequency ("ΔF") indicator. The modulation switch 716 can couple at different times a first frequency-modulation signal 722-1 or a second frequency-modulation signal 722-2 to both the first and second frequency-modulation paths 720-1 and 720-2. For the second frequency-modulation path 720-2, the sigma-delta modulator 710 is coupled between the modulation switch 716 and the control input node 470 of the multi-modulus divider 408-1. For the first frequency-modulation path 720-1, the multiplier 706, the decoder 708, and the modulation DAC 712 are coupled together in series between the modulation switch 716 and the VCO modulation input node 718 of the VCO 406. The multiplier 706 is coupled to the modulation switch 716, the decoder 708 is coupled between the multiplier 706 and the modulation DAC 712, and modulation DAC 712 is coupled between the decoder 708 and the VCO 406.

In the example scenario of FIG. 7-1, the calibration parameter 322 (e.g., of FIGS. 3 and 5) of the calibration signal 318 is realized as a gain 322-2 that indicates to the multiplier 706 of the PLL control circuitry 308 an amount of gain (K) to provide to the frequency-modulation signal 722 that is being coupled to the VCO modulation input node 718 of the VCO 406. The control signal 510 (e.g., of FIG. 5) that includes the PLL control parameter 512 is realized as a frequency-modulated signal 510-2 that includes a modulation frequency 512-2 (MF 512-2), as represented by the "K*ΔF" indicator.

FIG. 7-2 illustrates example aspects of the first and second frequency-modulation paths 720-1 and 720-2 of a portion 700-2 of the PLL control circuitry 308 of FIG. 7-1. With reference to FIGS. 7-1 and 7-2, the multiplier 706 includes a modulation input node 752, a gain control node 756, and a multiplier output node 754. The modulation input node 752 is coupled to the modulation switch 716 to accept the frequency-modulation signal 722. The gain control node 756 is coupled to the at least one calibration parameter input node 304 to accept the calibration signal 318 including a gain 322-2. The multiplier output node 754 is coupled to the VCO modulation input node 718 of the VCO 406 via the decoder 708 and the modulation DAC 712. The modulation DAC 712 can accept a modulation scaling indicator 758. In operation, the calibration controller 506 can also adjust the modulation scaling indicator 758 to fine tune the calibration results during the calibration operational mode 350 as described below. The decoder 708 and the sigma-delta modulator 710 can be implemented using digital circuitry, such as a portion of the digital circuitry 310 or a digital part of the PLL 130.

In the regular operational mode 360, a regular modulation source 702-1 provides the first frequency-modulation signal 722-1 to the modulation switch 716 via a first throw (e.g., the upper throw as depicted). In the calibration operational mode 350, a calibration modulation source 702-2 provides a second frequency-modulation signal 722-2 to the modulation switch 716 via a second throw (e.g., the lower throw as depicted). As illustrated, the modulation switch 716 includes a pole, the first throw, and the second throw. The pole of the modulation switch 716 is coupled to the first and second frequency-modulation paths 720-1 and 720-2. More specifically, the pole is coupled to the modulation input node 752 of the multiplier 706 and to an input of the sigma-delta modulator 710. The first throw of the modulation switch 716 accepts the first frequency-modulation signal 722-1 for the regular operational mode 360. The second throw accepts a second frequency-modulation signal 722-2 for the calibration operational mode 350. Although not shown, the modulation switch 716 can include a third throw, which accepts a third frequency-modulation signal for another calibration operational mode. This other calibration operational mode is described below.

Generally, the PLL calibration path 330 (e.g., of FIGS. 3 and 5) includes digital circuitry 310 to calibrate the PLL 130 (e.g., the PLL feedback loop 306 or the PLL control circuitry 308) based on an extracted signal 316 that is extracted from the PLL feedback loop 306 via the at least one switch 312 of the signal extraction path 132. The multiplier 706 applies the gain 322-2 to the frequency-modulation signal 722 that is routed to the VCO modulation input node 718 of the VCO 406 to modulate the output signal 324 of the PLL. Based on the extracted signal 316, the digital circuitry 310 adjusts an amount of the gain 322-2 (e.g., adjusts a gain level) that is applied to the frequency-modulation signal 722 by the multiplier 706. More specifically, the digital circuitry 310 adjusts the amount of the gain 322-2 applied to the frequency-modulation signal 722 responsive to a magnitude of at least one frequency component 724 of the extracted signal 316. The at least one frequency component 724 of the extracted signal 316 corresponds to a frequency of the frequency-modulation signal 722 (e.g., the second frequency-modulation signal 722-2 from the calibration modulation source 702-2) that is provided to the PLL control circuitry 308 during the calibration operational mode 350. In these manners, the components of the PLL calibration architecture 700-1 that correspond to the feedback path 326 (e.g., of FIG. 3) provide a mechanism for adjusting an amount of a gain 322-2 applied to a frequency-modulation path 720-1 of PLL control circuitry 308 of the PLL 130 based on the extracted signal 316 to calibrate the PLL 130.

In example implementations, for the calibration operational mode 350, the calibration modulation source 702-2 provides a square wave 704 as the second frequency-modulation signal 722-2. The PLL calibration procedure utilizes a step response by the PLL 130 to a square-wave modulation signal. The square wave 704 is generated at an intended peak frequency deviation of modulation during the regular operational mode 360. However, the square wave 704 is driven at or below the PLL bandwidth. The second frequency-modulation signal 722-2, which is realized as the square wave 704, is coupled to the first and second frequency-modulation paths 720-1 and 720-2 via the modulation switch 716, which is coupled to the calibration modulation source 702-2. For one of the two points of modulation of the PLL 130, the second frequency-modulation signal 722-2, with a frequency of ΔF, is routed through the sigma-delta modulator 710 and to the control input node 470 of the multi-modulus divider 408-1.

For another one of the two points of modulation of the PLL 130, the second frequency-modulation signal 722-2, with the frequency of ΔF, is routed to the multiplier 706. Responsive to the gain 322-2, which has an amount or level of "K," the multiplier 706 produces a frequency-modulated signal 510-2 having a modulation frequency 512-2 of "K*ΔF." After decoding at the decoder 708 and conversion to an analog version of the signal at the modulation DAC 712, the frequency-modulated signal 510-2 with the modulation frequency 512-2 is applied to the VCO modulation input node 718 of the VCO 406 for the second of the two modulation points. If the signals applied to the two points of modulation input for the PLL 130 are mismatched, the mismatch appears at the error signal 418, including at the filtered error signal 418-2.

The signal extraction path 132, with the switch 312 in a closed state as depicted, extracts the filtered error signal 418-2 as the extracted signal 316. The ADC 134 converts an analog extracted signal 316-1 to a digital extracted signal 316-2, which is provided to the DFT unit 504 of the digital circuitry 310. The DFT unit 504 performs a DFT operation on the digital extracted signal 316-1 to produce a DFT result 714. The DFT unit 504 can, for instance, measure the PLL step response to the square wave 704 using a single-point FFT to obtain the fundamental Fourier component. The DFT result includes the frequency component 724 having a frequency that corresponds to the square wave 704 being used to provide the second frequency-modulation signal 722-2 for the calibration operational mode 350. A magnitude of the frequency component 724 represents an amount of mismatch between the two modulation inputs of the PLL feedback loop 306 at the frequency of interest.

Accordingly, the calibration controller 506 performs an analysis using the frequency component 724. For example, the calibration controller 506 can compare a magnitude of the frequency component 724 to at least one threshold 508. The threshold 508 can be realized as a constant value, such as zero or some specified maximum level, or a percentage (such as 5, 10, or 25%) of a maximum measured magnitude of the frequency component 724. Based on the analysis, the calibration controller 506 generates the calibration signal 318 to have an updated gain 322-2 to produce an updated modulation frequency 512-2. The PLL calibration procedure can be continued until an amount for the gain 322-2 produces a targeted magnitude of the frequency component 724. By employing a square wave 704 as described above, the error signal 418, and the extracted signal 316 that is derived therefrom, is at the modulation rate. This appreciably reduces the effects of VCO flicker phase noise and ADC flicker noise in the error signal 418. Advantageously, calibration time is reduced by avoiding frequencies that overlap these noise frequencies.

FIG. 7-3 illustrates a graphical approach to calibrating a PLL with the second frequency-modulation path 720-2 of the PLL control circuitry 308 of FIG. 7-1. A graph 700-3 includes two axes; these axes correspond to the gain 322-2 (K) along the abscissa (horizontal) axis and a magnitude of the frequency component 724 along the ordinate (vertical) axis. As discussed above, the calibration controller 506 can compare a magnitude of the frequency component 724 with at least one threshold 508. Alternatively, the calibration controller 506 can take two measurements and interpolate a target value for the gain 322-2 (K). In the graph 700-3, a first measured value 782-1 has a magnitude of the frequency component 724 of "V1" with a corresponding gain 322-2 of "K1." A second measured value 782-2 has a magnitude of the frequency component 724 of "V2" with a corresponding gain 322-2 of "K2." These two measured values 782-1 and 782-2 can define a line. By interpolating along the line to a voltage of zero, the corresponding gain 322-2 of "K0" can determined, as indicated at a calibrated setting 784. The calibration controller 506 can then provide a calibration signal 318 having a gain 322-2 of "K0" to calibrate the PLL 130 and substantially (e.g., within the confines of the device technology) achieve a magnitude of zero for the frequency component 724.

The calibration controller 506 can track the voltage values over time to determine that one drops below the zero value. Alternatively, the calibration controller 506 can utilize phase information from in-phase (i) and quadrature phase (Q) components of the extracted signal 316. Although not shown, the digital circuitry 310 can include a complex down-converter that down-converts the digital extracted signal 316-2, such as to an intermediate frequency (IF). This complex down-conversion produces both I and Q signal components, which provide phase information. A direct-current (DC) average value for the I component can be computed with the single-point FFT using the complex down-converter together with a "top-hat" finite-impulse response (FIR) filter of programmable length. The complex down-converter and an associated receiver numerically-controlled oscillator (NCO) can be borrowed from the receive path for efficient use of digital circuitry resources.

In the regular operational mode 360, the frequency-modulated output signal 324 carries information and is transmitted via the transmit chain 252. For example, the output signal 324 can be amplified by the power amplifier 254 (PA 254 of FIG. 2) and emanated from the antenna 122 (of FIG. 4). Wireless signal emanations from electronic devices are regulated by governments around the world. In other words, wireless electronic devices are obligated to meet certain specifications to achieve certification for general RF usage. Calibration procedures as described herein can be instrumental in meeting these specifications. For example, calibration at full power can be achieved, even with a relatively high modulation index, by using a Pseudorandom Binary Sequence (PRBS) modulation for a frequency-modulation signal. Further, a lower-than-normal symbol rate (e.g., a ⅛ normal symbol rate) can be used with the PRBS modulation. To implement this scheme, the modulation switch 716 can include a third throw coupled to a third modulation source 702 for a third frequency-modulation signal 722 (not explicitly shown). For a calibration analysis using this third frequency-modulation signal 722, the extracted signal 316 can be de-spread in the digital circuitry 310 using the PRBS-modulated third frequency-modulation signal 722. This dispreading operation can be efficiently combined with the complex down-conversion operation.

Figure 8:
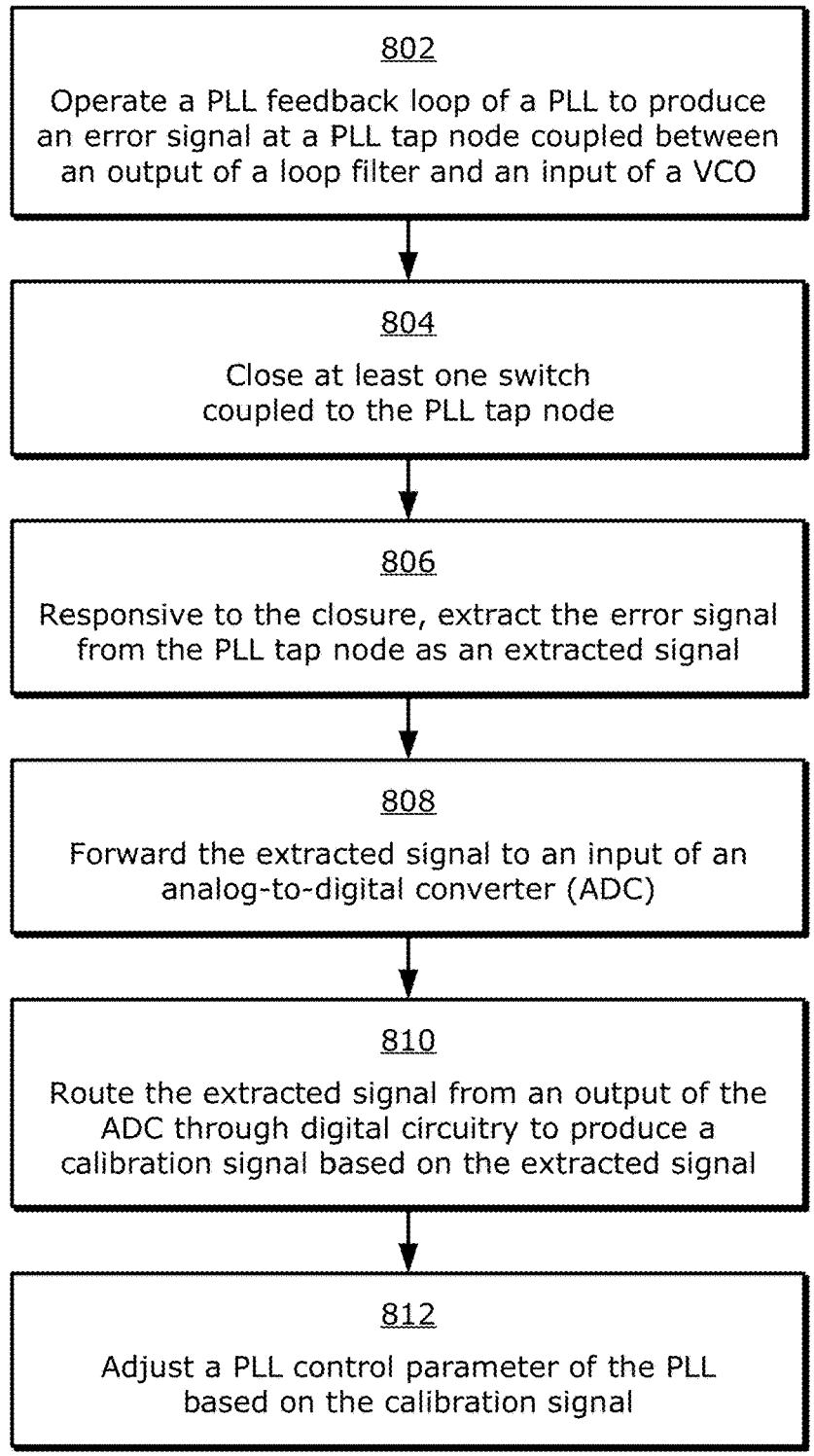
FIG. 8 is a flow diagram illustrating an example process for calibrating a phase-locked loop (PLL).

FIG. 8 is a flow diagram illustrating an example process 800 for calibrating a PLL. The process 800 is described in the form of a set of blocks 802-812 that specify operations that can be performed. However, operations are not necessarily limited to the order shown in FIG. 8 or described herein, for the operations may be implemented in alternative orders or in fully or partially overlapping manners. Also, more, fewer, and/or different operations may be implemented to perform the process 800, or an alternative process. Operations represented by the illustrated blocks of the process 800 may be performed by an electronic device 102, including a PLL 130, an associated PLL calibration path 330, or a calibration unit 334. More specifically, the operations of the process 800 may be performed by a PLL feedback loop 306, a signal extraction path 132, a feedback path 326, and PLL control circuitry 308 (e.g., of FIG. 3).

At block 802, a PLL feedback loop of a PLL is operated to produce an error signal at a PLL tap node coupled between an output of a loop filter and an input of a VCO. For example, an electronic device 102 can operate a PLL feedback loop 306 of a PLL 130 to produce an error signal 418 at a PLL tap node 302 coupled between an output of a loop filter 404 and an input of a voltage-controlled oscillator (VCO) 406. For instance, at least one signal propagating around the PLL feedback loop 306 can be realized as a filtered error signal 418-2 at the PLL tap node 302 between a filter output node 460 and a VCO input node 462.

At block 804, at least one switch that is coupled to the PLL tap node is closed. For example, the electronic device 102 can close at least one switch 312 coupled to the PLL tap node 302. This switch closure may be performed responsive to activation of a calibration operational mode 350 by a calibration unit 334. The calibration unit 334 may also open a receiver switch 606 of a receive chain 202 for the calibration operational mode 350.

At block 806, responsive to the closing, the error signal is extracted from the PLL tap node as an extracted signal. For example, responsive to closure of the switch 312, the electronic device 102 can extract the error signal 418 from the PLL tap node 302 as an extracted signal 316. A signal extraction path 132, for instance, may extract the filtered error signal 418-2 from the filter output node 460 to obtain an analog extracted signal 316-1.

At block 808, the extracted signal is forwarded to an input of an analog-to-digital converter (ADC). For example, the electronic device 102 can forward the extracted signal 316 to an input of an ADC 134. To do so, the signal extraction path 132 may forward the analog extracted signal 316-1 to an ADC input node 332-1 of the ADC 134. In some cases, the ADC 134 may be shared with the receive chain 202 and operably coupled to at least one antenna 122 by the receiver switch 606 for a regular operational mode 360.

At block 810, the extracted signal is routed from an output of the ADC through digital circuitry to produce a calibration signal based on the extracted signal. For example, the electronic device 102 can route the extracted signal 316 from an output of the ADC 134 through digital circuitry 310 to produce a calibration signal 318 based on the extracted signal 316. To do so, a feedback path 326 may route a digital extracted signal 316-2 from an ADC output node 332-2 of the ADC 134 through a digital signal analyzer 502 of the digital circuitry 310 to produce the calibration signal 318 that includes a calibration parameter 322 based on the digital extracted signal 316-2.

At block 812, a PLL control parameter of the PLL is adjusted based on the calibration signal. For example, the electronic device 102 can adjust a PLL control parameter 512 of the PLL 130 based on the calibration signal 318. PLL control circuitry 308, for instance, can produce a control signal 510 that includes the PLL control parameter 512 based on a calibration parameter 322 of the calibration signal 318. In some implementations, the calibration parameter 322 comprises an offset 322-1, and the PLL control parameter 512 comprises a current magnitude 512-1 that is applied to the PLL feedback loop 306 by a current offset circuit 604 of the PLL control circuitry 308. In other implementations, the calibration parameter 322 comprises a gain 322-2, and the PLL control parameter 512 comprises a modulation frequency 512-2 that is applied to a VCO modulation input node 718 of the VCO 406 using a frequency-modulated signal 510-2 that is generated by a multiplier 706 responsive to the gain 322-2.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
a phase-locked loop (PLL) comprising:
  an error determiner comprising an error output node;
  a loop filter comprising a filter input node and a filter output node, the filter input node coupled to the error output node;
  a voltage-controlled oscillator (VCO) comprising a VCO input node, the VCO input node coupled to the filter output node; and
  a PLL tap node coupled between the filter output node and the VCO input node; and
a signal extraction path comprising at least one switch and a voltage-to-current converter (V2I converter), the at least one switch coupled between the PLL tap node and the V2I converter.

2. The apparatus of claim 1, further comprising:
an analog-to-digital converter (ADC) comprising an ADC input node, wherein:
the at least one switch comprises a first terminal and a second terminal; and
the first terminal is coupled to the PLL tap node, and the second terminal is coupled to the ADC input node, such that the at least one switch is coupled between the PLL tap node and the ADC input node.

3. The apparatus of claim 2, wherein the at least one switch, responsive to being in a closed state, is configured to route a signal from the filter output node toward the ADC input node.

4. The apparatus of claim 2, wherein:
the V2I converter comprises a V2I-converter input node and a V2I-converter output node; and
the V2I-converter input node is coupled to the PLL tap node, and the V2I-converter output node is coupled to the ADC input node, such that the V2I converter is coupled in series with the at least one switch between the PLL tap node and the ADC input node.

5. The apparatus of claim 2, further comprising:
a receive chain,
wherein the receive chain comprises the ADC.

6. The apparatus of claim 5, further comprising:
at least one antenna,
wherein the receive chain comprises a receiver switch coupled between the at least one antenna and the ADC input node, the receiver switch configured to enable wireless signal reception via the at least one antenna and using the ADC responsive to the receiver switch being in a closed state.

7. The apparatus of claim 6, further comprising:
a display screen; and
at least one processor operably coupled to the display screen and the ADC of the receive chain, the at least one processor configured to present one or more graphical images on the display screen based on one or more wireless signals received via the at least one antenna and using the ADC and the PLL.

8. The apparatus of claim 1, wherein:
the signal extraction path is configured to extract an extracted signal from the PLL tap node responsive to the at least one switch being in a closed state.

9. The apparatus of claim 8, wherein:
the error determiner is configured to provide a determined error signal at the error output node;
the loop filter is configured to produce a filtered error signal at the filter output node based on the determined error signal; and
the signal extraction path is configured to:
  extract the filtered error signal from the PLL as the extracted signal via the PLL tap node; and
  route the extracted signal to the at least one switch.

10. The apparatus of claim 9, wherein:
the error determiner comprises a feedback input node and a reference input node, the reference input node configured to accept a reference signal;
the VCO comprises a VCO output node; and
the PLL comprises:
  a frequency divider coupled between the VCO output node and the feedback input node.

11. The apparatus of claim 1, wherein:
the PLL comprises at least one calibration parameter input node; and
the apparatus further comprises a feedback path coupled between the signal extraction path and the at least one calibration parameter input node.

12. The apparatus of claim 11, wherein:
the PLL comprises a PLL feedback loop and PLL control circuitry;
the PLL feedback loop comprises the error determiner, the loop filter, the VCO, and the PLL tap node;
the PLL control circuitry comprises the at least one calibration parameter input node and a current offset circuit; and
the current offset circuit is coupled between the at least one calibration parameter input node and the PLL feedback loop.

13. The apparatus of claim 12, wherein:
the feedback path comprises digital circuitry configured to calibrate the PLL based on an extracted signal that is extracted from the PLL feedback loop via the at least one switch of the signal extraction path;
the current offset circuit is configured to apply a current signal to the PLL feedback loop; and
the digital circuitry is configured to adjust a current magnitude of the current signal applied by the current offset circuit based on the extracted signal.

14. The apparatus of claim 13, wherein:
the digital circuitry is configured to adjust the current magnitude of the current signal applied by the current offset circuit responsive to a magnitude of a spur corresponding to at least one frequency component of the extracted signal.

15. The apparatus of claim 12, wherein:
the error determiner comprises a feedback input node;
the error determiner comprises a phase-frequency detector and a charge pump coupled together in series between the feedback input node and the error output node; and
the current offset circuit is coupled between the at least one calibration parameter input node and the filter input node.

16. The apparatus of claim 11, wherein:
the VCO comprises a VCO modulation input node;
the PLL comprises a PLL feedback loop and PLL control circuitry;
the PLL feedback loop comprises the error determiner, the loop filter, the VCO, and the PLL tap node;
the PLL control circuitry comprises the at least one calibration parameter input node, a multiplier, and a modulation switch; and
the multiplier comprises a gain control node, a modulation input node, and a multiplier output node; the gain control node coupled to the at least one calibration parameter input node, the multiplier output node coupled to the VCO modulation input node, and the modulation input node coupled to the modulation switch.

17. The apparatus of claim 16, wherein:
the modulation switch comprises a pole, a first throw, and a second throw; the pole coupled to the modulation input node, the first throw configured to accept a first frequency-modulation signal for a regular operational mode, the second throw configured to accept a second frequency-modulation signal for a calibration operational mode.

18. The apparatus of claim 17, wherein:
the modulation switch comprises a third throw, the third throw configured to accept a third frequency-modulation signal for another calibration operational mode.

19. The apparatus of claim 16, wherein:
the feedback path comprises digital circuitry configured to calibrate the PLL based on an extracted signal that is extracted from the PLL feedback loop via the at least one switch of the signal extraction path;
the multiplier is configured to apply a gain to a frequency-modulation signal that is routed to the VCO modulation input node to modulate an output signal of the PLL; and
the digital circuitry is configured to adjust an amount of the gain applied to the frequency-modulation signal by the multiplier based on the extracted signal.

20. The apparatus of claim 19, wherein:
the digital circuitry is configured to adjust the amount of the gain applied to the frequency-modulation signal responsive to a magnitude of at least one frequency component of the extracted signal, the at least one frequency component of the extracted signal corresponding to a frequency of the frequency-modulation signal provided during a calibration operational mode.

21. An apparatus comprising:
a phase-locked loop (PLL) comprising:
  an error determiner comprising an error output node;
  a loop filter comprising a filter input node and a filter output node, the filter input node coupled to the error output node;
  a voltage-controlled oscillator (VCO) comprising a VCO input node, the VCO input node coupled to the filter output node; and
  a PLL tap node coupled between the filter output node and the VCO input node; and
means for extracting an extracted signal from the PLL via the PLL tap node, the means for extracting comprising at least one switch and means for converting a voltage to a current, the at least one switch coupled between the PLL tap node and the means for converting.

22. The apparatus of claim 21, further comprising:
means for sharing a portion of a receive path to process the extracted signal as part of a PLL calibration procedure.

23. The apparatus of claim 21, further comprising:
means for adjusting a current magnitude of a current signal applied to a PLL feedback loop of the PLL based on the extracted signal to calibrate the PLL.

24. The apparatus of claim 21, further comprising:
means for adjusting an amount of a gain applied to a frequency-modulation path of PLL control circuitry of the PLL based on the extracted signal to calibrate the PLL.

25. A method for calibrating a phase-locked loop (PLL), the method comprising:
operating a PLL feedback loop of the PLL to produce an error signal at a PLL tap node coupled between an output of a loop filter and an input of a voltage-controlled oscillator (VCO);
closing at least one switch coupled to the PLL tap node;
responsive to the closing, extracting the error signal from the PLL tap node as an extracted signal;
providing the extracted signal to a voltage-to-current converter (V2I converter) to produce a current-based extracted signal;
forwarding the current-based extracted signal to an input of an analog-to-digital converter (ADC);
routing the current-based extracted signal from an output of the ADC through digital circuitry to produce a calibration signal based on the current-based extracted signal; and
adjusting a PLL control parameter of the PLL based on the calibration signal.

26. The method of claim 25, further comprising:
receiving, via at least one antenna, a wireless signal to produce a received signal; and
providing the received signal to the input of the ADC.

27. The method of claim 25, wherein:
the PLL control parameter comprises a current magnitude of a current signal; and
the adjusting comprises:
adjusting the current magnitude of the current signal based on the calibration signal to produce an updated current magnitude; and
applying the current signal with the updated current magnitude to the PLL feedback loop to calibrate the PLL.

28. The method of claim 25, wherein:
the PLL control parameter comprises a modulation frequency of a frequency-modulation path, the modulation frequency responsive to a gain; and
the adjusting comprises:
adjusting the gain used in the frequency-modulation path based on the calibration signal to produce an updated modulation frequency; and
applying, using the frequency-modulation path, a frequency-modulated signal with the updated modulation frequency to a VCO modulation input node of the VCO to calibrate the PLL.

29. An apparatus comprising:
digital circuitry;
at least one antenna;
an analog-to-digital converter (ADC), the ADC comprising an ADC input node and an ADC output node; the ADC input node coupled to the at least one antenna, and the ADC output node coupled to the digital circuitry;
a phase-locked loop (PLL) comprising a PLL feedback loop, the PLL feedback loop comprising:
an error determiner;
a loop filter coupled to the error determiner;
a voltage-controlled oscillator (VCO) coupled to the loop filter;
a frequency divider coupled between the VCO and the error determiner; and
a PLL tap node coupled along the PLL feedback loop; and
a signal extraction path coupled between the PLL tap node and the ADC input node of the ADC, the signal extraction path comprising at least one switch and a voltage-to-current converter (V2I converter), the at least one switch coupled between the PLL tap node and the V2I converter.

30. The apparatus of claim 29, wherein:
the PLL comprises PLL control circuitry comprising a calibration parameter input node; and
the apparatus further comprises a PLL calibration path coupled between the PLL tap node and the calibration parameter input node, the PLL calibration path comprising the signal extraction path, the ADC, and the digital circuitry.

* * * * *